United States Patent
Andersson et al.

(10) Patent No.: US 10,516,419 B2
(45) Date of Patent: Dec. 24, 2019

(54) RATE MATCHING METHODS FOR LDPC CODES

(71) Applicant: Telefonaktiebolaget LM Ericsson (publ), Stockholm (SE)

(72) Inventors: Mattias Andersson, Sundbyberg (SE); Yufei Blankenship, Kildeer, IL (US); Sara Sandberg, Luleå (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 155 days.

(21) Appl. No.: 15/564,248

(22) PCT Filed: Aug. 10, 2017

(86) PCT No.: PCT/IB2017/054889
§ 371 (c)(1),
(2) Date: Oct. 4, 2017

(87) PCT Pub. No.: WO2018/029633
PCT Pub. Date: Feb. 15, 2018

(65) Prior Publication Data
US 2019/0052290 A1    Feb. 14, 2019

Related U.S. Application Data
(60) Provisional application No. 62/374,688, filed on Aug. 12, 2016.

(51) Int. Cl.
*H03M 13/00* (2006.01)
*H03M 13/11* (2006.01)
*H03M 13/27* (2006.01)

(52) U.S. Cl.
CPC ..... *H03M 13/6393* (2013.01); *H03M 13/116* (2013.01); *H03M 13/1168* (2013.01);
(Continued)

(58) Field of Classification Search
CPC .......... H03M 13/6393; H03M 13/116; H03M 13/1168; H03M 13/6356; H03M 13/6362; H03M 13/27
See application file for complete search history.

(56) References Cited

U.S. PATENT DOCUMENTS 9,942,886 B1 * 4/2018 Wilson .............. H04W 72/0453
2008/0320353 A1 * 12/2008 Blankenship ......... H04L 1/0068
714/746

(Continued)

OTHER PUBLICATIONS

Johnson, S.J., "Iterative Error Correction: Turbo, Low-Density Parity-Check and Repeat-Accumulate Codes", Cambridge University Press, 2010, pp. 37-39. (Year: 2010).*
(Continued)

*Primary Examiner* — Kyle Vallecillo
(74) *Attorney, Agent, or Firm* — Baker Botts, LLP

(57) ABSTRACT

A method of producing a set of coded bits from a set of information bits for transmission between a first node (110, 115) and a second node (110, 115) in a wireless communications system (100), the method comprises generating (904) a codeword vector by encoding the set of information bits with a low-density parity-check code, wherein the codeword vector is composed of systematic bits and parity bits. The method comprises performing (908) circular buffer-based rate matching on the generated codeword vector to produce the coded bits for transmission, wherein the circular buffer-based rate matching comprises puncturing a first plurality of systematic bits.

50 Claims, 14 Drawing Sheets

(52) U.S. Cl.
CPC ... *H03M 13/6356* (2013.01); *H03M 13/6362* (2013.01); *H03M 13/27* (2013.01)

(56) References Cited

U.S. PATENT DOCUMENTS

| | | | | |
|---|---|---|---|---|
| 2009/0147724 | A1* | 6/2009 | Nimbalker | H04L 1/0069 370/315 |
| 2010/0054353 | A1* | 3/2010 | Roh | H04L 1/0003 375/260 |
| 2014/0177527 | A1* | 6/2014 | Lee | H04L 5/001 370/328 |
| 2017/0012739 | A1* | 1/2017 | Shen | H03M 13/13 |
| 2017/0373809 | A1* | 12/2017 | Kim | H03M 13/296 |
| 2018/0007683 | A1* | 1/2018 | You | H04L 1/0067 |
| 2018/0019840 | A1* | 1/2018 | Lomayev | H04L 1/0058 |
| 2018/0034585 | A1* | 2/2018 | Kim | H04L 1/0057 |
| 2019/0013901 | A1* | 1/2019 | Nimbalker | H04L 1/0057 |

OTHER PUBLICATIONS

PCT, Notification of Transmittal of the International Search Report and the Written Opinion of the International Searching Authority, or the Declaration, International Application No. PCT/IB2017/054889, 6 pages, dated Nov. 9, 2017.

PCT, Written Opinion of the International Searching Authority, International Application No. PCT/IB2017/054889, 10 pages, dated Nov. 9, 2017.

Technical Report, European Telecommunications Standards Institute (ETSI), TR 138 912, "5G; Study on New Radio (NR) access technology", 3GPP TR 38.912 version 14.0.0 Release 14, XP014291080, 77 pages, May 5, 2017.

Mostafa El-Khamy, et al., "HARQ Rate-Compatible Polar Codes for Wireless Channels", 2015 IEEE Global Communications Conference, XP055397700, 6 pages, Jan. 1, 2014.

Jung-Fu (Thomas) Cheng, et al., "Analysis of Circular Buffer Rate Matching for LTE Turbo Code", 2003 IEEE 58th Vehicular Technology Conference, XP055152149, 5 pages, Jan. 1, 2008.

3GPP TSG RAN WG1 Meeting #86; Gothenburg, Sweden; Title: LDPC Code Design for NR (R1-166929); Source: Ericsson; Agenda Item: 8.1.4.1; Aug. 22-26, 2016.

PCT Notification of Transmittal of the International Preliminary Report on Patentability for International Application No. PCT/IB2017/054889 with attached Second Amendment Under Article 34; dated Nov. 20, 2018.

PCT, Written Opinion of the International Preliminary Examining Authority, International Application No. PCT/IB2017/054889, dated Jul. 23, 2018.

3GPP TSG RAN WG1 Meeting #88; Gothenburg, Sweden; Source: Ericsson; Title: LDPC Code Design for NR (R1-166929)—Aug. 22-26, 2016.

* cited by examiner

RATE MATCHING METHODS FOR LDPC CODES

PRIORITY

This nonprovisional application is a U.S. National Stage Filing under 35 U.S.C. § 371 of International Patent Application Serial No. PCT/IB2017/054889 filed Aug. 10, 2017, and entitled "Rate Matching Methods For LDPC Codes" which claims priority to U.S. Provisional Patent Application No. 62/374,688 filed Aug. 12, 2016, both of which are hereby incorporated by reference in their entirety.

TECHNICAL FIELD

The present disclosure relates, in general, to wireless communications and, more particularly, to rate matching methods for low-density parity-check (LDPC) codes.

BACKGROUND

LDPC codes are easily described through a parity-check matrix (PCM), where the rows and columns correspond to check nodes and variable nodes, respectively. Each "1" in the PCM corresponds to an edge between a check node and a variable node.

FIG. 1 illustrates an example PCM 5 and the corresponding bipartite graph 10. PCM 5 can be mapped to bipartite graph 10, which is composed of check nodes 15 and variable nodes 20, where the rows and columns of PCM 5 correspond to check nodes 15 and variable nodes 20, respectively. Each entry h(i,j)=1 in PCM 5 corresponds to an edge between a check node 15 and a variable node 20.

The code rate (R) of PCM 5 is defined as the number of information bits k divided by the number of coded bits n, R=k/n, where n is the number of columns in PCM 5 and k equals the number of columns minus the number of rows of PCM 5.

An important class of LDPC codes are quasi-cyclic (QC) LDPC codes. The PCM H of a QC-LDPC code is of size m×n, and can be represented by a base matrix H_base of size $m_b$=m/Z and $n_b$=n/Z, and a lifting factor Z. Each entry of H_base contains either the number −1 or one or more numbers between 0 and Z−1. For example, let i and j be integers between 0 and (m/Z−1), and 0 and (n/Z−1), respectively. Then the submatrix formed from the entries in rows Z*i to Z*(i+1)−1 and columns Z*j to Z*(j+1)−1 (assuming that indexing of rows and columns start from 0), are determined by the entry in row i and column j of H_base in the following way.

If H_base(i,j)=−1, then the submatrix in the expanded binary matrix H is equal to the Z by Z zero matrix. The number −1 used to denote zero submatrices can be arbitrarily selected as long as it is not a number between 0 and Z−1.

If H_base(i,j) contains one or more integers $k_1, k_2, \ldots k_d$ between 0 and Z−1, the submatrix in the expanded binary matrix H is equal to the sum of the shifted identity matrices $P\_k_1+P\_k_2+ \ldots +P\_k_d$, where each Z×Z submatrix P_k is obtained from the Z by Z identity matrix by cyclically shifting the columns to the right k times.

LDPC codes may be optimized for any block length and/or any code rate. In practical communication systems, however, it is not efficient to use different PCMs for each alternative of block lengths and rates. Instead, rate matching is implemented through shortening, puncturing, and/or repetition. As an example, LDPC codes for 802.11n are specified with 12 mother codes (3 different block lengths and 4 different rates). PCMs for all other block lengths and code rates needed are specified through rate matching mechanisms (including shortening, puncturing, and/or repetition) applied to one of the 12 mother codes.

Shortening is a technique to obtain codes of shorter length and lower rate from a dedicated LDPC code by fixing the value of some information bits to some known values (e.g., "0") when encoding. The positions of the fixed bits are assumed to be available to both the encoder and the decoder. For a systematic code, the shortened bits are then punctured from the codeword before transmission. In the decoding process, the fixed bits are given infinite reliability. Shortening reduces the size of the information block from k to $k_{tx}$.

Puncturing, on the other hand, is a technique where some coded bits are not transmitted. This increases the code rate of the dedicated LDPC mother code and decreases code block size.

With repetition, some of the coded bits are repeated and transmitted more than one time. In contrast to puncturing, repetition increases the code block size.

Together, puncturing, shortening, and repetition change the number of coded bits from n to $n_{tx}$. After rate matching is applied, the native code size (k, n) defined by the PCM is modified to an actual code size ($k_{tx}$, $n_{tx}$). Hence, for a set of $k_{tx}$ information bits, $n_{tx}$ coded bits are produced for transmission. Correspondingly, the actual code rate is calculated based on $R_{tx}=k_{tx}/n_{tx}$.

Given a dedicated LDPC code of code size (k, n), a simple and effective rate matching method is necessary for the actual code size ($K_{tx}$, $N_{tx}$) needed for a particular transmission. Some LDPC codes puncture some systematic bits by design to improve the code performance, unrelated to rate matching. It is not clear, however, how to perform the rate matching as defined in 802.11n in this case.

SUMMARY

To address the foregoing problems with existing approaches, disclosed is a method of producing a set of coded bits from a set of information bits for transmission between a first node and a second node in a wireless communications system. The method comprises generating a codeword vector by encoding the set of information bits with a low-density parity-check code, wherein the codeword vector is composed of systematic bits and parity bits. The method comprises performing circular buffer-based rate matching on the generated codeword vector to produce the coded bits for transmission, wherein the circular buffer-based rate matching comprises puncturing a first plurality of systematic bits.

In certain embodiments, the low-density parity-check code may be specified through a parity check matrix. The first plurality of systematic bits that are punctured may precede, in the codeword vector, a second plurality of systematic bits that are not punctured.

In certain embodiments, a plurality of redundancy versions may be defined over the circular buffer such that coded bits for a retransmission are read from the circular buffer according to a corresponding redundancy version defined for the retransmission. The method may comprise performing circular buffer-based rate matching on the generated codeword vector to produce coded bits for the retransmission, wherein the circular buffer-based rate matching for the retransmission comprises puncturing the first plurality of systematic bits. The first plurality of systematic bits punctured for the retransmission may include an even multiple of Z systematic bits, where Z is a lifting factor of the parity check matrix.

In certain embodiments, puncturing the first plurality of systematic bits may comprise omitting to write the first plurality of systematic bits into a circular buffer. In certain embodiments, puncturing the first plurality of systematic bits may comprise skipping the first plurality of systematic bits when reading the coded bits from a circular buffer. In certain embodiments, the first plurality of punctured systematic bits may include an even multiple of Z systematic bits, where Z is a lifting factor of the parity check matrix.

In certain embodiments, performing circular buffer-based rate matching on the generated codeword vector may comprise reading the systematic bits and the parity bits out of a circular buffer to produce the transmission vector for transmission over a wireless channel. Reading the systematic bits and the parity bits out of the circular buffer to produce the transmission vector for transmission over the wireless channel may comprise, if a number of bits of the transmission vector is larger than the total number of bits in the circular buffer, repeating one or more bits in the circular buffer by wrapping around.

In certain embodiments, generating the codeword vector by encoding the set of information bits may comprise attaching dummy bits to the set of information bits, the dummy bits comprising bits of known value, to produce an information vector, and encoding the information vector. The attached dummy bits may comprise a second plurality of systematic bits that is separate from the punctured first plurality of systematic bits. In certain embodiments, the method may comprise puncturing the attached dummy bits. In certain embodiments, puncturing the attached dummy bits may comprise omitting to write the attached dummy bits into the circular buffer. In certain embodiments, puncturing the attached dummy bits may comprise skipping the attached dummy bits when reading the coded bits from the circular buffer.

In certain embodiments, a subset of the systematic bits may be omitted from being written into the circular buffer. In certain embodiments, a subset of the parity bits may be omitted from being written into the circular buffer.

In certain embodiments, the method may comprise puncturing a subset of the systematic bits written into the circular buffer in a first transmission over the wireless channel. The method may comprise including the subset of the systematic bits that were punctured in a retransmission over the wireless channel.

In certain embodiments, the method may comprise puncturing bits column-wise such that bits are punctured evenly from each of a plurality of rows and a weight distribution of the parity check matrix is maintained in the circular buffer. The punctured bits may be systematic bits other than the first plurality of systematic bits. The systematic bits and the parity bits may be read out so that a channel interleaver is implemented as part of performing circular buffer-based rate matching on the generated codeword vector. In certain embodiments, the punctured bits may have a higher column weight than non-punctured bits. In certain embodiments, the systematic bits and the parity bits may be read out such that no channel interleaving effect is implemented.

In certain embodiments, performing circular buffer-based rate matching on the generated codeword vector may comprise writing at least a portion of the systematic bits and the parity bits as defined by the parity check matrix into a rectangular circular buffer, the rectangular circular buffer comprising one or more rows and one or more columns.

In certain embodiments, the wireless communications system may comprise a new radio system.

Also disclosed is a first node for producing a set of coded bits from a set of information bits for transmission to a second node in a wireless communications system. The first node comprises processing circuitry. The processing circuitry is configured to generate a codeword vector by encoding the set of information bits with a low-density parity-check code, wherein the codeword vector is composed of systematic bits and parity bits. The processing circuitry is configured to perform circular buffer-based rate matching on the generated codeword vector to produce the coded bits for transmission, wherein the circular buffer-based rate matching comprises puncturing a first plurality of systematic bits.

Certain embodiments of the present disclosure may provide one or more technical advantages. For example, in certain embodiments the circular buffer-based rate matching methods may be designed such that an arbitrary ($K_{tx}$, $N_{tx}$) can be provided using a single procedure. As another example, in certain embodiments there may be no need to define a separate procedure for each of the shortening, puncturing, and repetition. Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION

Figure 1:
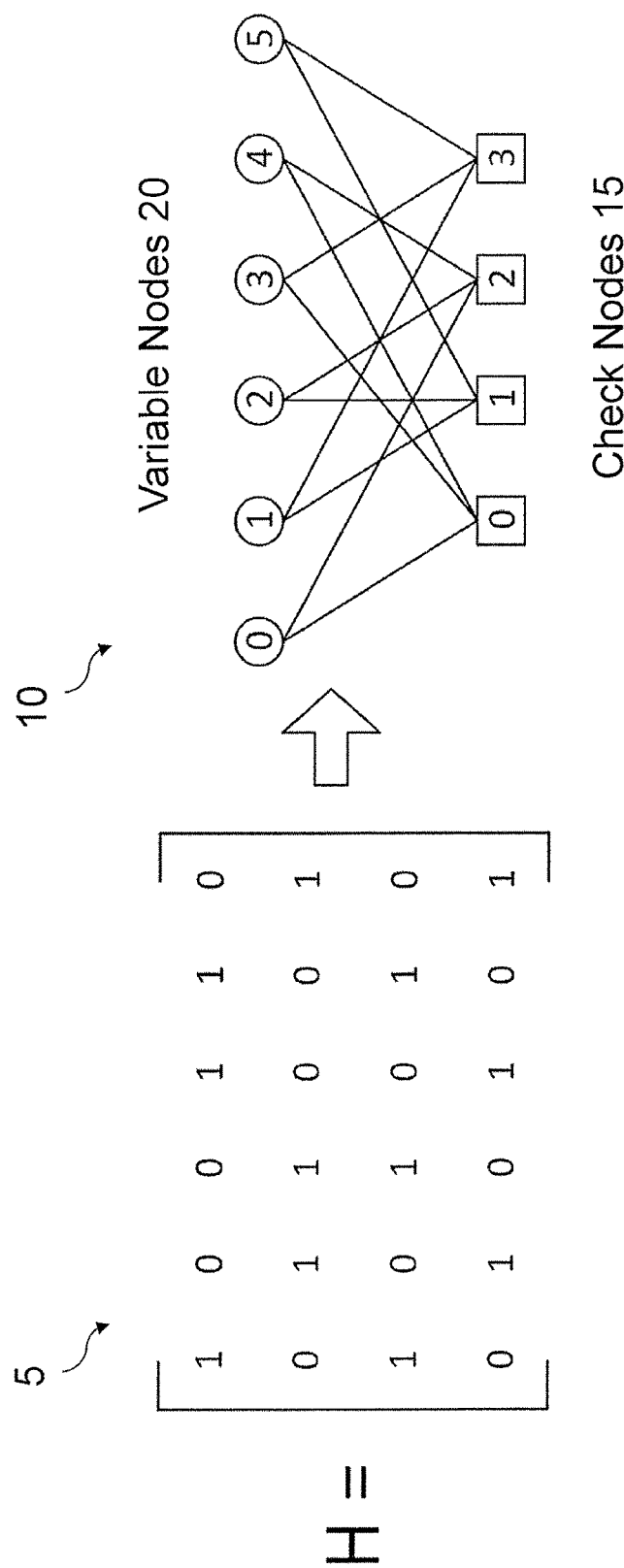
FIG. 1 illustrates an example PCM and the corresponding bipartite graph.

As described above, given a dedicated LDPC code of code size (k, n), a simple and effective rate matching method is necessary for the actual code size ($K_{tx}$, $N_{tx}$) needed for a particular transmission. Some LDPC codes puncture some systematic bits by design to improve the code performance, unrelated to rate matching. It is not clear, however, how to perform the rate matching, for example as defined in 802.11n, in this case. The present disclosure contemplates various embodiments that may provide a simple and effective rate matching method for LDPC codes, where shortening, puncturing and/or repetition is applied.

In certain embodiments, rate matching through shortening and puncturing may be applied to a mother code with as high code rate as possible. If the number of parity bits specified by the mother code is about the same as the number of parity bits needed for the wanted code, rate-matching may be mainly achieved by shortening instead of puncturing, with less performance loss as the result.

According to one example embodiment, a method of producing a set of coded bits from a set of information bits for transmission between a first node and a second node in a wireless communications system is disclosed. The first node generates a codeword vector by encoding the set of information bits with an LDPC code, wherein the codeword vector is composed of systematic bits and parity bits. The first node performs circular buffer-based rate matching on the generated codeword vector to produce the coded bits for transmission, wherein the circular buffer-based rate matching comprises puncturing a first plurality of systematic bits. In certain embodiments, the LDPC code may be specified through a PCM. The first plurality of systematic bits that are punctured may precede, in the codeword vector, a second plurality of systematic bits that are not punctured.

In certain embodiments, a plurality of redundancy versions may be defined over the circular buffer such that coded bits for a retransmission are read from the circular buffer according to a corresponding redundancy version defined for the retransmission. The first node may perform circular buffer-based rate matching on the generated codeword vector to produce coded bits for the retransmission, wherein the circular buffer-based rate matching for the retransmission comprises puncturing the first plurality of systematic bits. The first plurality of systematic bits punctured for the retransmission may include an even multiple of Z systematic bits, where Z is a lifting factor of the parity check matrix.

In certain embodiments, the first node may puncture the first plurality of systematic bits by omitting to write the first plurality of systematic bits into a circular buffer. In certain embodiments, the first node may puncture the first plurality of systematic bits by skipping the first plurality of systematic bits when reading the coded bits from a circular buffer.

Certain embodiments of the present disclosure may provide one or more technical advantages. For example, in certain embodiments the circular buffer-based rate matching methods may be designed such that an arbitrary ($K_{tx}$, $N_{tx}$) can be provided using a single procedure. As another example, in certain embodiments there may be no need to define a separate procedure for each of the shortening, puncturing, and repetition. Other advantages may be readily apparent to one having skill in the art. Certain embodiments may have none, some, or all of the recited advantages.

Figure 2:
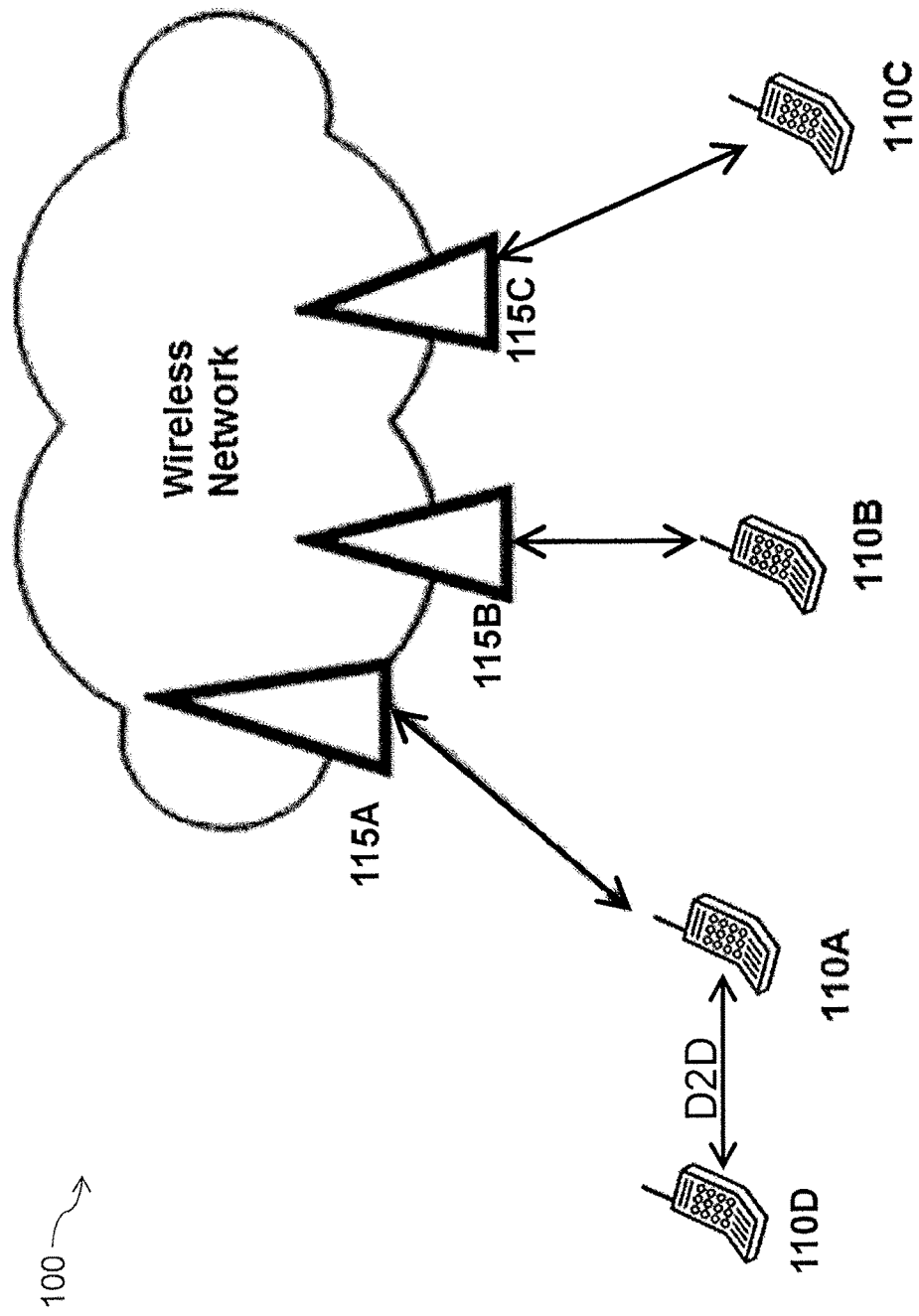
FIG. 2 is a block diagram illustrating an embodiment of a network, in accordance with certain embodiments.

FIG. 2 is a block diagram illustrating an embodiment of a network 100, in accordance with certain embodiments. Network 100 includes one or more UE(s) 110 (which may be interchangeably referred to as wireless devices 110) and one or more network node(s) 115. UEs 110 may communicate with network nodes 115 over a wireless interface. For example, a UE 110 may transmit wireless signals to one or more of network nodes 115, and/or receive wireless signals from one or more of network nodes 115. The wireless signals may contain voice traffic, data traffic, control signals, and/or any other suitable information. In some embodiments, an area of wireless signal coverage associated with a network node 115 may be referred to as a cell. In some embodiments, UEs 110 may have device-to-device (D2D) capability. Thus, UEs 110 may be able to receive signals from and/or transmit signals directly to another UE.

In certain embodiments, network nodes 115 may interface with a radio network controller. The radio network controller may control network nodes 115 and may provide certain radio resource management functions, mobility management functions, and/or other suitable functions. In certain embodiments, the functions of the radio network controller may be included in network node 115. The radio network controller may interface with a core network node. In certain embodiments, the radio network controller may interface with the core network node via an interconnecting network. The interconnecting network may refer to any interconnecting system capable of transmitting audio, video, signals, data, messages, or any combination of the preceding. The interconnecting network may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof.

In some embodiments, the core network node may manage the establishment of communication sessions and various other functionalities for UEs 110. UEs 110 may exchange certain signals with the core network node using the non-access stratum (NAS) layer. In NAS signaling, signals between UEs 110 and the core network node may be transparently passed through the radio access network (RAN). In certain embodiments, network nodes 115 may interface with one or more network nodes over an internode interface, such as, for example, an X2 interface.

As described above, example embodiments of network 100 may include one or more wireless devices 110, and one or more different types of network nodes capable of communicating (directly or indirectly) with wireless devices 110.

In some embodiments, the non-limiting term UE is used. UEs 110 described herein can be any type of wireless device capable of communicating with network nodes 115 or another UE over radio signals. UE 110 may also be a radio communication device, target device, D2D UE, machine-type-communication UE or UE capable of machine to machine communication (M2M), low-cost and/or low-complexity UE, a sensor equipped with UE, Tablet, mobile terminals, smart phone, laptop embedded equipped (LEE), laptop mounted equipment (LME), USB dongles, Customer Premises Equipment (CPE), etc. UE 110 may operate under either normal coverage or enhanced coverage with respect to its serving cell. The enhanced coverage may be interchangeably referred to as extended coverage. UE 110 may also operate in a plurality of coverage levels (e.g., normal coverage, enhanced coverage level 1, enhanced coverage level 2, enhanced coverage level 3 and so on). In some cases, UE 110 may also operate in out-of-coverage scenarios.

Also, in some embodiments generic terminology, "network node" is used. It can be any kind of network node, which may comprise a base station (BS), radio base station, Node B, base station (BS), multi-standard radio (MSR) radio node such as MSR BS, evolved Node B (eNB), gNB, network controller, radio network controller (RNC), base station controller (BSC), relay node, relay donor node controlling relay, base transceiver station (BTS), access point (AP), radio access point, transmission points, transmission nodes, Remote Radio Unit (RRU), Remote Radio Head (RRH), nodes in distributed antenna system (DAS), Multi-cell/multicast Coordination Entity (MCE), core network node (e.g., Mobile Switching Center (MSC), Mobility Management Entity (MME), etc.), Operations and Management (O&M), Operations Support System (OSS), Self-Organizing Network (SON), positioning node (e.g., Evolved Serving Mobile Location Center (E-SMLC)), Minimization of Drive Test (MDT), or any other suitable network node.

In certain embodiments, generic terminology "node" is used. It can be any kind of UE or network node, such as UE 110 or network node 115 described above.

The terminology such as network node and UE should be considered non-limiting and does in particular not imply a certain hierarchical relation between the two. In general, "network node" could be considered as device 1 (or a first node) and "UE" device 2 (or a second node), and these two devices communicate with each other over some radio channel.

Example embodiments of UE 110, network nodes 115, and other network nodes (such as radio network controller or core network node) are described in more detail below with respect to FIGS. 10-14.

Although FIG. 2 illustrates a particular arrangement of network 100, the present disclosure contemplates that the various embodiments described herein may be applied to a variety of networks having any suitable configuration. For example, network 100 may include any suitable number of UEs 110 and network nodes 115, as well as any additional elements suitable to support communication between UEs or between a UE and another communication device (such as a landline telephone). Furthermore, although certain embodiments may be described as implemented in a New Radio (NR) network, the embodiments may be implemented in any appropriate type of telecommunication system supporting any suitable communication standards (including 5G standards) and using any suitable components, and are applicable to any radio access technology (RAT) or multi-RAT systems in which a UE receives and/or transmits signals (e.g., data). For example, the various embodiments described herein may be applicable to NR, Long Term Evolution (LTE), LTE-Advanced, 5G, UMTS, HSPA, GSM, cdma2000, WCDMA, WiMax, UMB, WiFi, 802.11n, another suitable radio access technology, or any suitable combination of one or more radio access technologies. Although certain embodiments may be described in the context of wireless transmissions in the downlink (DL), the present disclosure contemplates that the various embodiments are equally applicable in the uplink (UL).

As described above, given a dedicated LDPC code of code size (k, n), a simple and effective rate matching method is necessary for the actual code size ($K_{rx}$, $N_{rx}$) needed for a particular transmission (e.g., between a first node and a second node in a wireless communications system, such as a NR system). In certain embodiments, an effective rate matching method for LDPC codes is disclosed, where shortening, puncturing and/or repetition is applied.

In certain embodiments, a first node (e.g., one of network nodes 115 described above) produces a set of coded bits from a set of information bits for transmission to a second node (e.g., one of UEs 110 described above) in a wireless communications system. In certain embodiments, the wireless communications system may be a NR system. The set of information bits may be associated with a transmission between the first node and the second node in the wireless communications system. Note that although certain embodiments may be described using one of network nodes 115 as the first node and one of UEs 110 as the second node, this is for purposes of example only and the various embodiments described herein are not limited to such an example. Rather, the present disclosure contemplates that the first node and the second node may be any suitable network entities.

In certain embodiments, the first node generates an information vector from a set of information bits. To illustrate, consider the following example. Assume for a set of km information bits the encoding of the LDPC code may be performed using the following procedure, where the quasi-cyclic parity check matrix H is composed of (n-k) rows and n columns, $m_b$=m/Z and $n_b$=n/Z. In certain embodiments, generating an information vector from the set of information bits may comprise attaching (k−$k_{rx}$) dummy bits to the set of $k_{rx}$ information bits to make an information vector U of k bits. The dummy bits are usually assigned a known value of "0". The attachment of dummy bits to information bits may also be referred to as shortening of the code. In certain embodiments, attaching dummy bits to the set of information bits may comprise copying the set of information bits into a longer vector of length "information bits+dummy bits." In certain embodiments, the first node may puncture the attached dummy bits (e.g., by not writing the attached dummy bits into the circular buffer or by not reading the attached dummy bits from the circular buffer).

The first node generates a codeword vector by encoding the set of information bits with an LDPC code. The codeword vector may be composed of systematic bits and parity bits. The LDPC codes considered here are quasi-cyclic protograph-based LDPC codes. Quasi-cyclic PCMs are partitioned into square sub-blocks (sub-matrices) of size Z×Z. These submatrices are either cyclic-permutations of the identity matrix or null submatrices. A cyclic-permutation matrix Pi is obtained from the Z×Z identity matrix by cyclically shifting the columns to the right by i elements. The matrix P0 is the Z×Z identity matrix. The LDPC code may be specified through a PCM. Quasi-cyclic LDPC codes are conveniently described through a base matrix, which is a matrix where each integer i denotes the cyclic-permutation matrix Pi. The PCM is obtained from a base matrix by selecting a lifting size Z and replacing each entry in the base matrix with the corresponding Z×Z matrix.

Continuing the example above, in certain embodiments the first node encodes information vector U with the PCM H. The encoding generates a codeword vector C of n bits. Typically, systematic encoding is used so that the codeword vector C is composed of two sets of bits: [systematic bits; parity bits]. In this example, the length-k vector of systematic bits is equal to the information vector U. The length-k, k=$k_b$*Z, systematic bits are $k_b$ groups of Z bits, [$u_0$, $u_1, \ldots u_{z-1}, | u_z, u_{z+1}, \ldots u_{2z-1}, | \ldots, u\_(k_{b-1})*Z, u\_(k_{b-1})*Z+1, \ldots u\_(k_b*Z-1)]$. The length-(n-k), m=n-k=$m_b*Z$, parity bits are $m_b$ groups of Z bits, $[p_0, p_1, \ldots p_{z-1}, | p_z, p_{z+1}, \ldots p_{2z-1}, | \ldots, p\_(m_{b-1})*Z, p\_(m_{b-1})*Z+1, \ldots p\_(m_b*Z-1)]$. The property of the LDPC code dictates that the codeword vector C multiplied by the transpose of PCM H has to produce a vector of zeros (i.e., $H*C^T=0$).

The first node performs circular buffer-based rate matching on the generated codeword vector to produce the coded bits for transmission. The circular buffer-based rate matching may comprise puncturing a first plurality of systematic bits (e.g., when producing a transmission vector from the codeword vector). Continuing the example above, in certain embodiments the first node performs rate-matching on the codeword vector C, removes the $(k-k_{tx})$ dummy bits, and produces a vector of length $n_{tx}$ for transmission over the wireless channel.

In the following description of FIGS. 3-8, it is assumed that at least a portion of the [systematic bits, parity bits] as defined by the PCM are written into a circular buffer. In the examples of FIGS. 3-8, the "circular buffer" used for rate matching is presented in a rectangular format. It should be understood, however, that wrapping around when reaching the end of the rectangle means that the buffer is circular. Furthermore, note that presentation of the circular buffer in rectangular format is for purposes of example only, and the various embodiments described herein are not limited to such an example.

In the examples of FIGS. 3-8, those [systematic bits, parity bits] as defined by the PCM that are written into the rectangular circular buffer are written in row-wise, starting from the upper left corner, ending at bottom right corner. As one example, after writing the bits into the rectangle, it can be used for generating a codeword of arbitrary block length $n_{tx}$. In such a scenario, $n_{tx}$ bits are read out from the rectangle. As another example, after writing the bits into the rectangle, it can be used for generating retransmissions to be used in/for incremental redundancy. In such a scenario, for the first transmission, some bits are read out. In case of a second transmission, an additional number of bits are read out. While the read out of each retransmission may start anywhere in the rectangular-shaped circular buffer, preferably the read-out starts close to where the read out for the previous transmission ended. This can be generalized to more than one retransmission.

FIGS. 3-8 below illustrate various example embodiments of how the [systematic bits, parity bits] are read out of the rectangular circular buffer to produce the $n_{tx}$ bits for transmission (e.g., to a second node). In certain embodiments, the first node may count $n_{tx}$ bits from the rectangle and transmit them. In certain embodiments, one or more predefined rules may influence how the bits are read out of the rectangular circular buffer to produce the $n_{tx}$ bits for transmission. As one example, if $n_{tx}$ is smaller than the total number of bits in the circular buffer, then the bits left behind in the rectangle are punctured (i.e., not transmitted). As another example, if $n_{tx}$ is larger than the total number of bits in the circular buffer, then the read-out procedure wraps around and some bits in the circular buffer are repeated, leading to the repetition effect of rate matching. As still another example, if the $k_{tx}$ actual information bits are attached with $(k-k_{tx})$ bits of known value before encoding with the PCM, then shortening is achieved. In some cases, the $(k-k_{tx})$ shortening bits can be prepended in front of the $k_{tx}$ actual information bits. In some cases, the $(k-k_{tx})$ shortening bits can be attached to the end of the $k_{tx}$ actual information bits. The shortened bits are known and carry no information, hence they should be removed before transmission.

As yet another example, in cases of a PCM where some of the information bits are punctured by design, these information bits can be left out of the rectangular circular buffer. In FIGS. 3-8 below, these information bits are referred to as skipped bits. As another example, in the case of a PCM where some of the information bits are punctured by design, combined with shortening, the punctured bits can either be part of the shortened bits, or not be part of the shortened bits.

Figure 3:
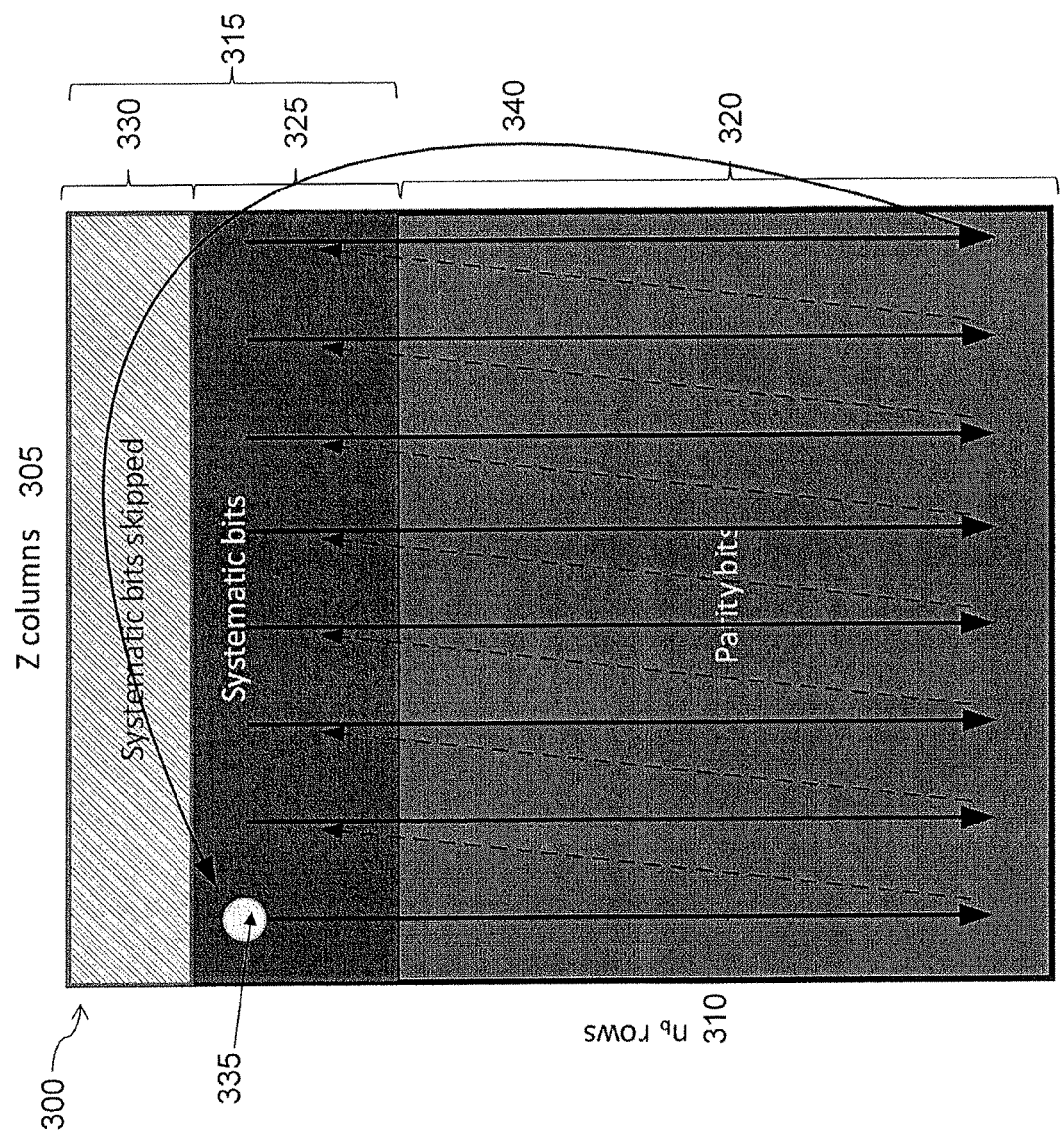
FIG. 3 illustrates an example in which the systematic bits and parity bits are read out column-wise, in accordance with certain embodiments.

FIG. 3 illustrates an example in which the systematic bits and parity bits are read out column-wise, so that a channel interleaver is also implemented as part of the rate matching procedure, in accordance with certain embodiments. FIG. 3 illustrates a rectangular circular buffer 300 with Z columns 305 and $n_b$ rows 310. Within rectangular circular buffer 300, there are a plurality of systematic bits 315 and a plurality of parity bits 320. The plurality of systematic bits 315 includes systematic bits that are not skipped 325 and a plurality of systematic bits that are skipped (i.e., punctured) 330. In the example of FIG. 3, bits are read out of rectangular circular buffer 300 beginning at starting point 335. Arrow 340 illustrates the wrapping around that occurs when the end of rectangular circular buffer 300 is reached.

As shown in the example of FIG. 3, since there are $Z*n_b$ columns (or codeword bits) in H, one way is to form a ($n_b$ rows*Z columns) rectangle 300, and puncture bits column-wise. The effect is to puncture bits evenly from each of the size-Z rows, and maintain roughly the same weight-distribution as the original H. This has the effect of puncturing one bit from each of the $n_b$ set first, where each set has Z bits. In certain embodiments, the plurality of systematic bits that are skipped (i.e., punctured) 330 include an even multiple of Z systematic bits, where Z is a lifting factor of the PCM.

As illustrated in FIG. 3, some of systematic bits 315 can be punctured (i.e., skipped systematic bits 330) to achieve better performance than puncturing parity bits 320. The systematic bits punctured in the $1^{st}$ transmission, or for a code of higher rate, are usually mapped to high-column weight. The starting location 335 (x,y) can be chosen such that the appropriate group of systematic bits are skipped (i.e., punctured), while keeping the decoding performance as good as possible.

Although FIG. 3 illustrates skipped systematic bits 330 as included in rectangular circular buffer 300, this is only one non-limiting example. In certain embodiments, for example, skipped systematic bits 330 may not be written into circular buffer 300. Since the code is designed with the knowledge that the first systematic bits will be punctured, in some cases these bits should not be included at all in circular buffer 300. It may be more advantageous to repeat any of the already transmitted bits than transmitting the first systematic bits designed to be punctured. This is a consequence of the very high variable node degree of the punctured systematic bits 330, which implies that these nodes/bits have high connectivity with the rest of the graph and their value can often be deduced from the value of other bits.

Figure 4:
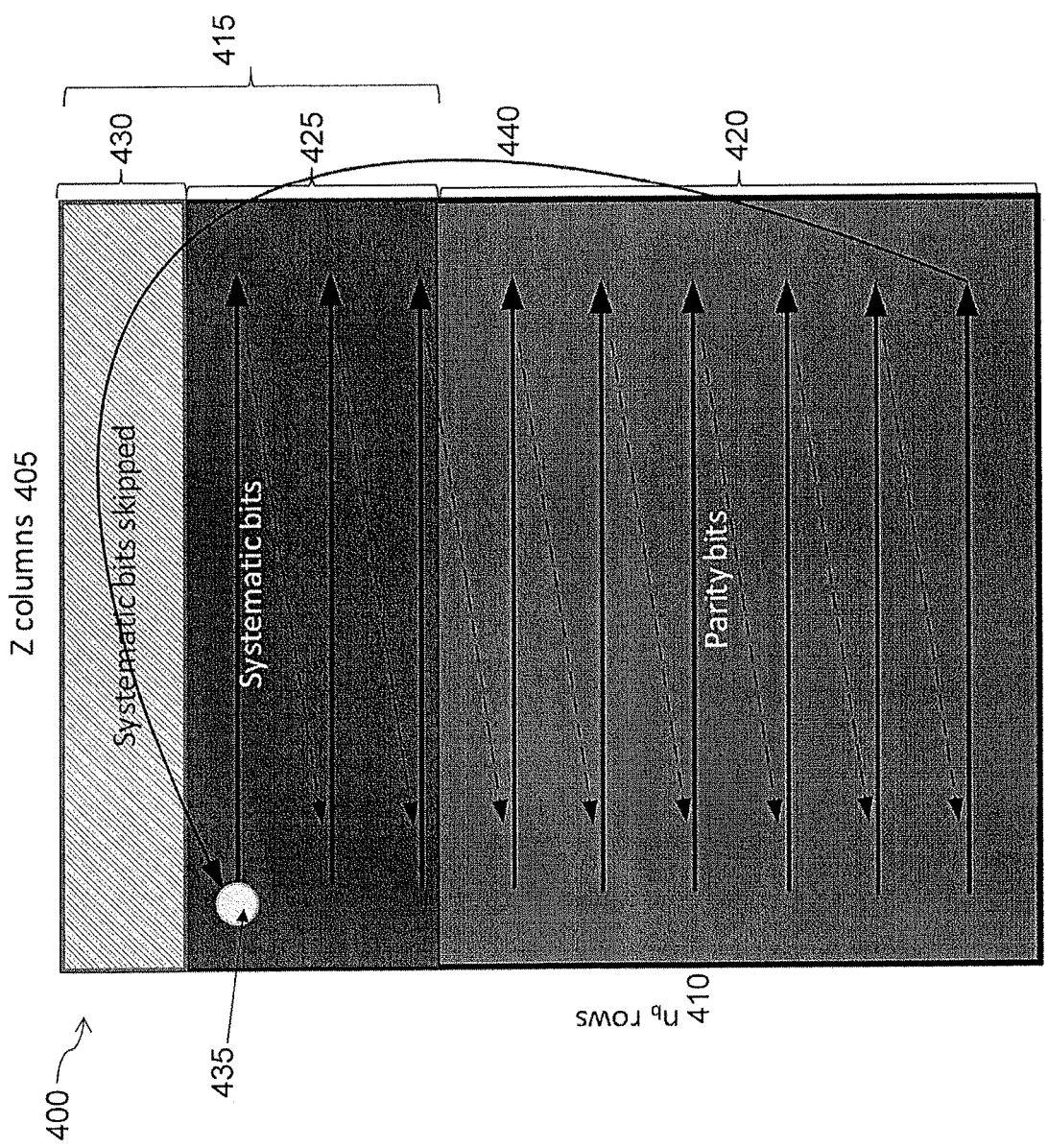
FIG. 4 illustrates an example in which the systematic bits and parity bits are read out row-wise, in accordance with certain embodiments.

FIG. 4 illustrates an example in which the systematic bits and parity bits are read out row-wise, in accordance with certain embodiments. FIG. 4 illustrates a rectangular circular buffer 400 with Z columns 405 and $n_b$ rows 410. Within rectangular circular buffer 400, there are a plurality of systematic bits 415 and a plurality of parity bits 420. The plurality of systematic bits 415 includes systematic bits that are not skipped 425 and a plurality of systematic bits that are skipped 430. In the example of FIG. 4, bits are read out of rectangular circular buffer 400 beginning at starting point 435. Arrow 440 illustrates the wrapping around that occurs when the end of rectangular circular buffer 400 is reached.

As noted above, in the example shown in FIG. 4 the systematic bits 425 and parity bits 420 are read out row-wise. Thus, no channel interleaving effect is implemented (in contrast to the example of FIG. 3 described above).

Additionally, since puncturing columns of high weight has less impact to performance, the puncturing pattern can be arranged so that more bits of high column weight are punctured than bits of low column weight. It would be possible to search for which parity bits 420 to puncture that gives the least impact on threshold. The nodes in the protograph, which corresponds to the $n_b$ rows, can then be reordered so that puncturing from the end of rectangular circular buffer 400 is optimal.

Figure 5:
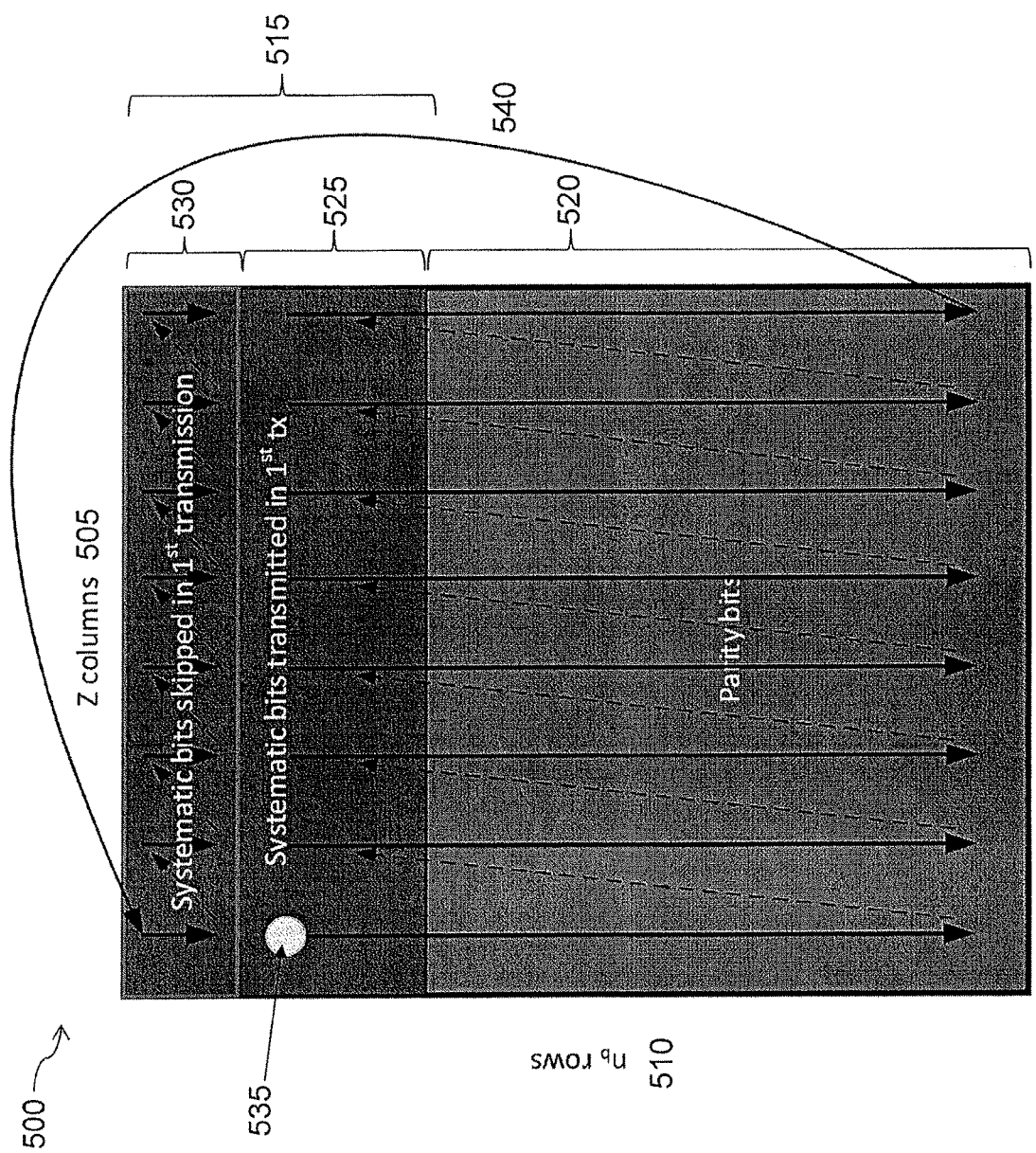
FIG. 5 illustrates an example in which, when the end of the circular buffer is reached, it wraps around to the systematic bits that were skipped in a first transmission, in accordance with certain embodiments.

FIG. 5 illustrates an example in which, when the end of the circular buffer is reached, it wraps around to the systematic bits that were skipped in a first transmission, in accordance with certain embodiments. FIG. 5 illustrates a rectangular circular buffer 500 with Z columns 505 and $n_b$ rows 510. Within rectangular circular buffer 500, there are a plurality of systematic bits 515 and a plurality of parity bits 520. The plurality of systematic bits 515 includes systematic bits that are not skipped in a first transmission 525 and a plurality of systematic bits that are skipped in the first transmission 530. In the example of FIG. 5, bits are read out of rectangular circular buffer 500 beginning at starting point 535. Arrow 540 illustrates the wrapping around that occurs when the end of rectangular circular buffer 500 is reached.

As described above, FIG. 5 illustrates an example in which, when the end of circular buffer 500 is reached, it wraps around to the systematic bits that were skipped in the first transmission 530 (as shown by arrow 540). In the example embodiment of FIG. 5, systematic bits 530 that were skipped in the first transmission, or for the generation of a code word of higher rate, are included in a retransmission, or when generating a low rate codeword.

In certain embodiments, the bits may be read from rectangular circular buffer 500 in a horizontal (i.e., row-wise fashion), beginning at starting point 535.

Figure 6:
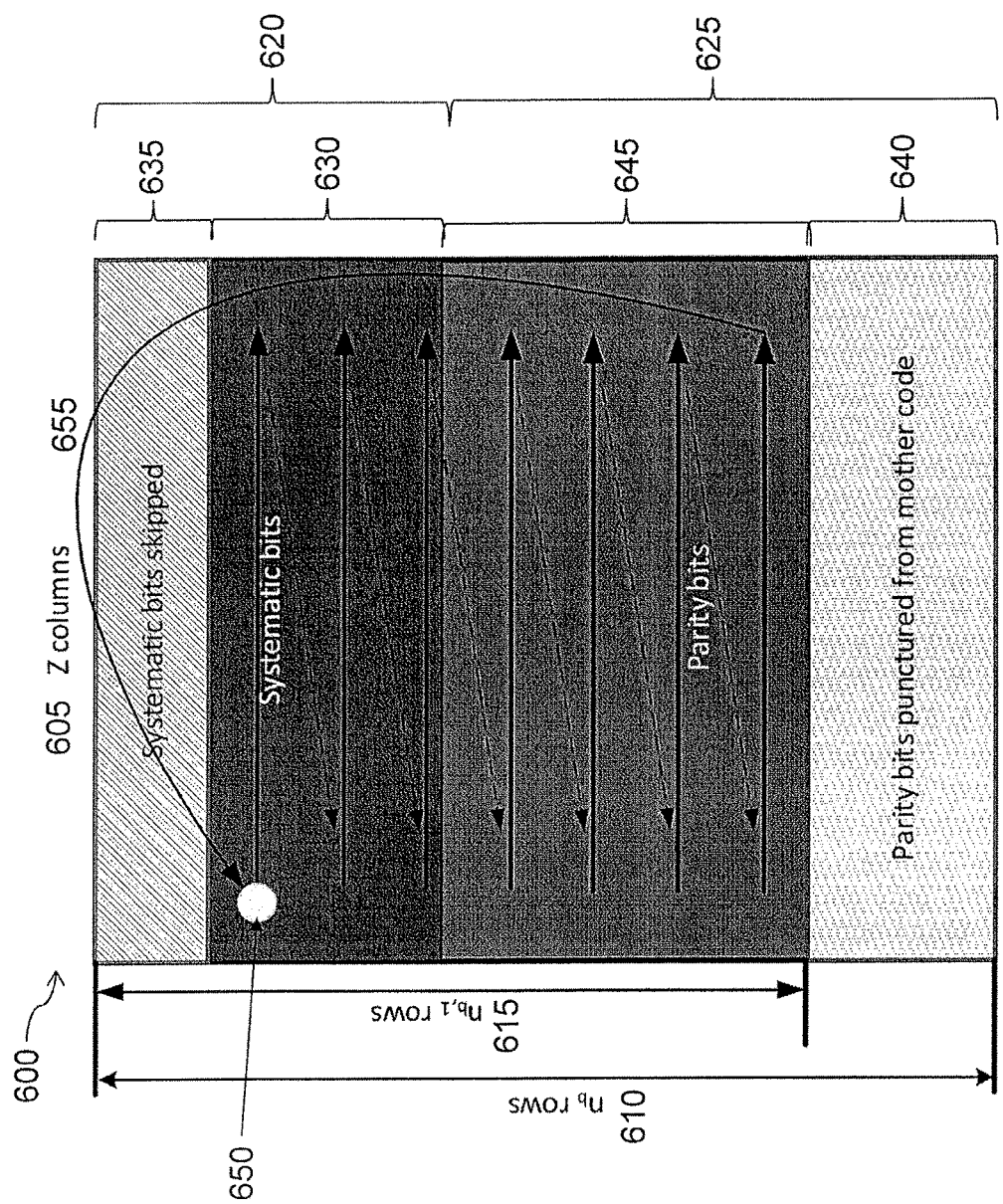
FIG. 6 illustrates an example in which the circular buffer utilizes a subset of coded bits as defined by the PCM, so that the code rate used for actual transmission is higher than a code rate R of the PCM, in accordance with certain embodiments.

FIG. 6 illustrates an example in which the circular buffer utilizes a subset of coded bits as defined by the PCM, so that the code rate used for actual transmission is higher than code rate R of the PCM, in accordance with certain embodiments. FIG. 6 illustrates a rectangular circular buffer 600 with Z columns 605, $n_b$ rows 610 and $n_{b,1}$ rows 615. As shown in FIG. 6, there are a plurality of systematic bits 620 and a plurality of parity bits 625. The plurality of systematic bits 620 includes systematic bits that are not skipped 630 and a plurality of systematic bits that are skipped 635. The plurality of parity bits 625 includes parity bits that are punctured from the mother code 640 and parity bits that are not punctured from the mother code 645. In the example of FIG. 6, bits are read out of rectangular circular buffer 600 beginning at starting point 650. Arrow 655 illustrates the wrapping around that occurs when the end of rectangular circular buffer 600 is reached.

In the example embodiment shown in FIG. 6, some of the parity bits 625 generated from the PCM are not put in the rectangle and transmitted (i.e., parity bits that are punctured from the mother code 640), but retransmissions and lower code rates are generated by reading from the top left of the rectangle again (i.e., at starting point 650). This can be useful, for example, if lower complexity decoding is preferred, because only a submatrix of the PCM is required to decode the transmission in this case.

In certain embodiments, the bits may be read from rectangular circular buffer 600 in a vertical (i.e., column-wise fashion), beginning at starting point 650.

Figure 7:
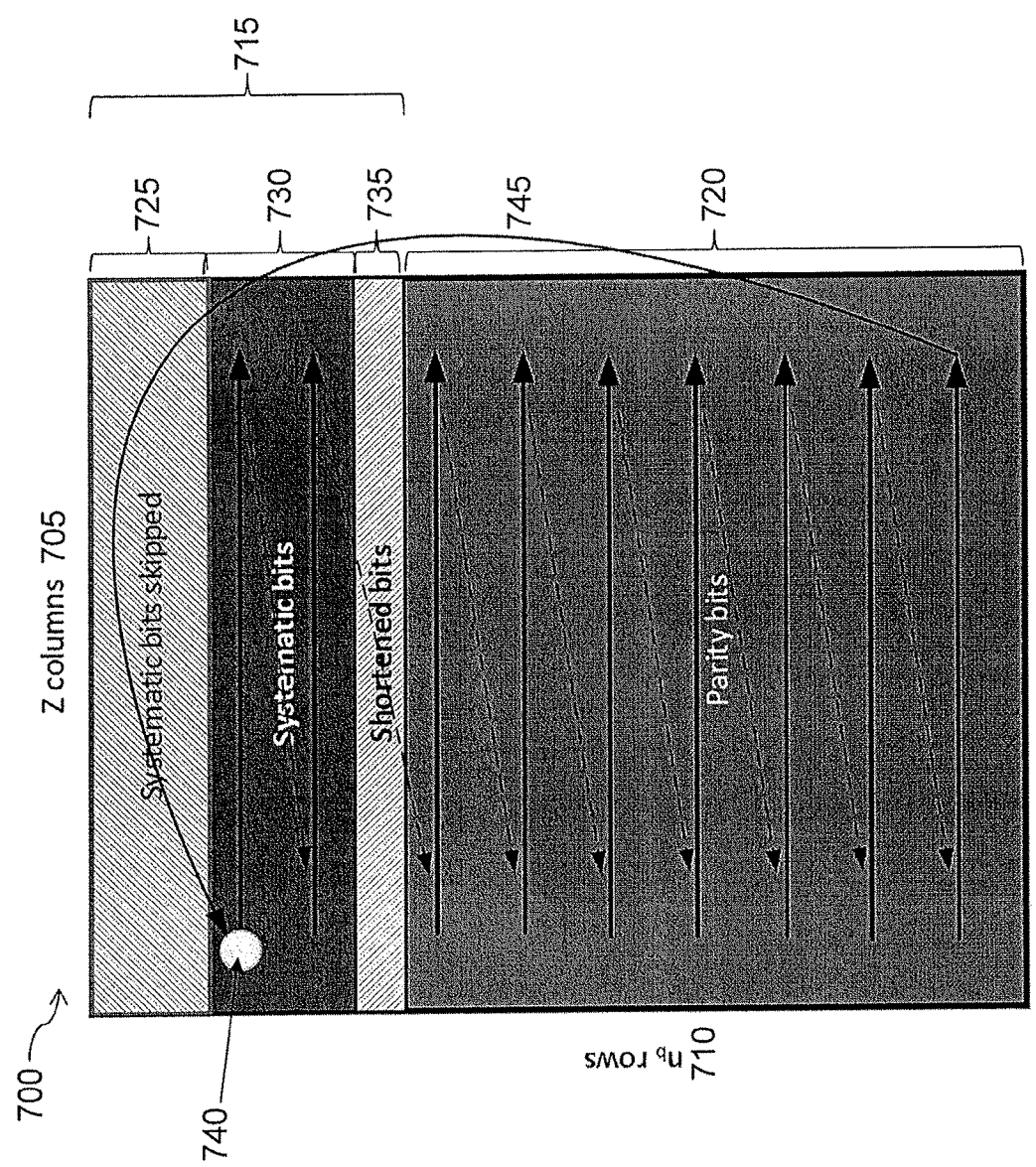
FIG. 7 illustrates an example in which shortening is also implemented as part of the rate matching procedure, in accordance with certain embodiments.

FIG. 7 illustrates an example in which shortening is also implemented as part of the rate matching procedure, in accordance with certain embodiments. FIG. 7 illustrates a rectangular circular buffer 700 with Z columns 705 and $n_b$ rows 710. Within rectangular circular buffer 700, there are a plurality of systematic bits 715 and a plurality of parity bits 720. The plurality of systematic bits 715 includes a plurality of systematic bits that are skipped 725, a plurality of systematic bits that are not skipped 730, and a plurality of shortened bits 735. In the example of FIG. 7, bits are read out of rectangular circular buffer 700 beginning at starting point 740. Arrow 745 illustrates the wrapping around that occurs when the end of rectangular circular buffer 700 is reached.

As described above, in the example embodiment of FIG. 7 shortening is also implemented as part of the rate matching procedure. In the example of FIG. 7, shortened bits 735 are first chosen among the systematic bits that are not skipped 730. In some cases, if the number of shortened bits is larger than the number of systematic bits that are not skipped 730, some of the skipped systematic bits 725 will be shortened as well. The shortened bits are set to a known value, and skipped when reading out the codeword to be transmitted (as they are known at the receiver). The receiver (e.g., a second node) inserts infinite reliability values for the shortened bits and calculates the reliability for the rest of the bits using a similar rectangle. According to an example alternative embodiment, the bits may be read in a vertical fashion, again skipping the shortened bits 735 and the bits that are designed to be skipped 725.

Figure 8:
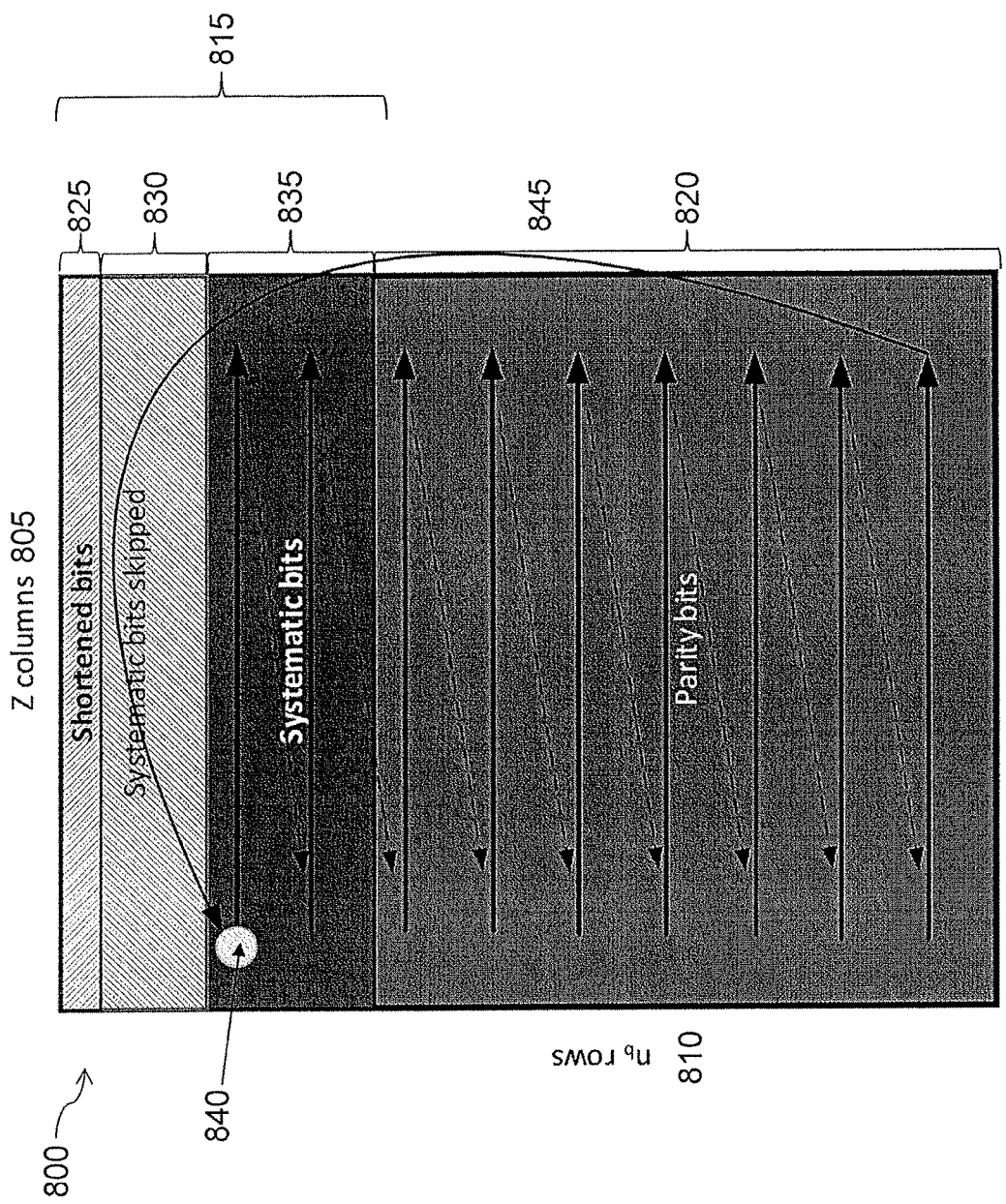
FIG. 8 illustrates an example in which shortening is applied first to those systematic bits that are skipped, and to non-skipped bits if the number of shortened bits is larger than the number of skipped bits, in accordance with certain embodiments.

FIG. 8 illustrates an example in which shortening is applied first to those systematic bits that are skipped, and only to non-skipped bits if the number of shortened bits is larger than the number of skipped bits, in accordance with certain embodiments. FIG. 8 illustrates a rectangular circular buffer 800 with Z columns 805 and $n_b$ rows 810. Within rectangular circular buffer 800, there are a plurality of systematic bits 815 and a plurality of parity bits 820. The plurality of systematic bits 815 includes a plurality of shortened bits 825, a plurality of systematic bits that are skipped 830, and a plurality of systematic bits that are not skipped 835. In the example of FIG. 8, bits are read out of rectangular circular buffer 800 beginning at starting point 840. Arrow 845 illustrates the wrapping around that occurs when the end of rectangular circular buffer 800 is reached.

In the example embodiment of FIG. 8, the shortened information bits 825 are first chosen from the systematic bits that are skipped 830, and only if more bits need to be shortened than the number of skipped bits, the other systematic bits 835 are shortened. In certain embodiments, the bits may be read in a vertical fashion.

In certain embodiments, the various embodiments described above with respect to FIGS. 3-8 can be further combined. The present disclosure contemplates that the various example embodiments described above may be combined in any suitable manner. For example, the example embodiments described above in relation to FIGS. 7 and 8 can be combined with the example embodiment of FIG. 5 so that the systematic bits that are skipped at first can be included in codes of lower rate, or in retransmissions. Note, however, that shortened bits are not included in a transmission as they are known to the receiver.

Figure 9:
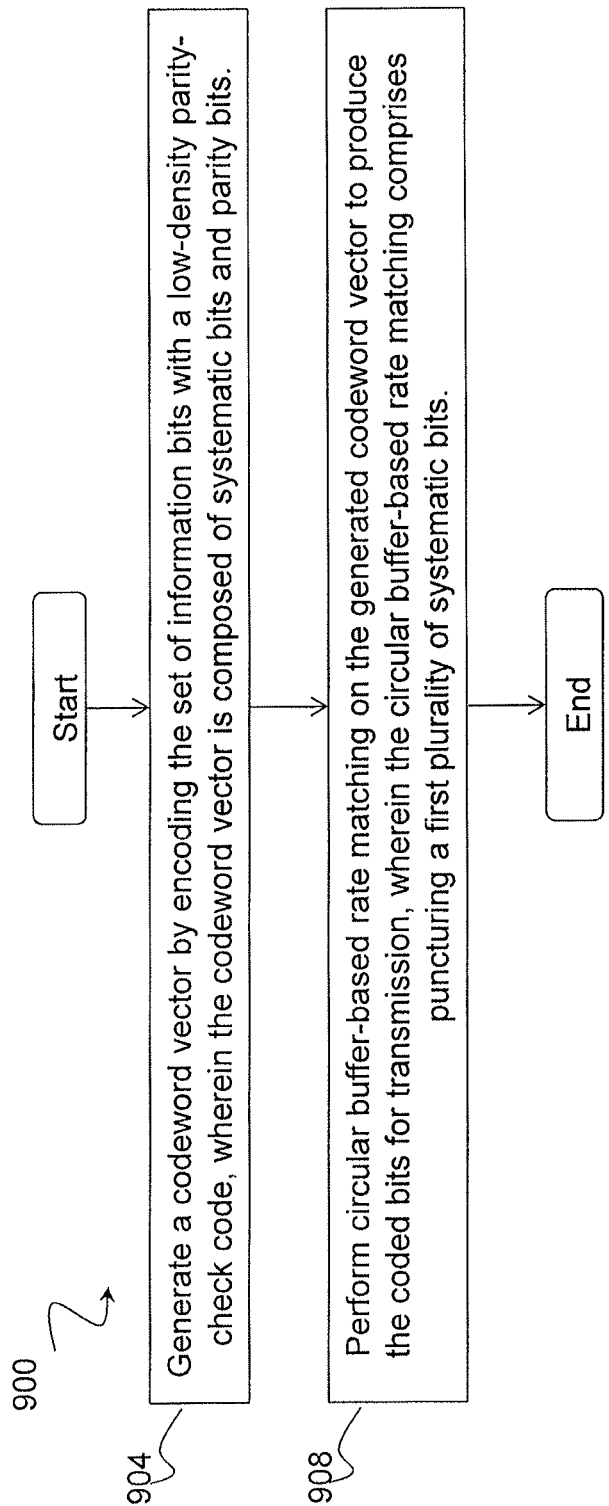
FIG. 9 is a flow diagram of a method in a first node, in accordance with certain embodiments.

FIG. 9 is a flow diagram of a method 900 in a first node, in accordance with certain embodiments. More particularly, method 900 is a method of producing a set of coded bits from a set of information bits for transmission between a first node and a second node in a wireless communications system. Method 900 begins at step 904, where the first node generates a codeword vector by encoding the set of information bits with a low-density parity-check code, wherein the codeword vector is composed of systematic bits and parity bits. In certain embodiments, the LDPC code may be specified through a PCM. The wireless communications system may comprise a NR system.

In certain embodiments, generating the codeword vector by encoding the set of information bits may comprise attaching dummy bits to the set of information bits, the dummy bits comprising bits of known value, to produce an information vector, and encoding the information vector. The attached dummy bits may comprise a second plurality of systematic bits that is separate from the punctured first plurality of systematic bits. In certain embodiments, the method may comprise puncturing the attached dummy bits. Puncturing the attached dummy bits may comprise omitting to write the attached dummy bits into the circular buffer. Puncturing the attached dummy bits may comprise skipping the attached dummy bits when reading the coded bits from the circular buffer.

At step 908, the first node performs circular buffer-based rate matching on the generated codeword vector to produce the coded bits for transmission, wherein the circular buffer-based rate matching comprises puncturing a first plurality of systematic bits. In certain embodiments, the first plurality of systematic bits that are punctured may precede, in the codeword vector, a second plurality of systematic bits that are not punctured.

In certain embodiments, a plurality of redundancy versions may be defined over the circular buffer such that coded bits for a retransmission are read from the circular buffer according to a corresponding redundancy version defined for the retransmission. Method 900 may comprise performing circular buffer-based rate matching on the generated codeword vector to produce coded bits for the retransmission, wherein the circular buffer-based rate matching for the retransmission comprises puncturing the first plurality of systematic bits. The first plurality of systematic bits punctured for the retransmission may include an even multiple of Z systematic bits, where Z is a lifting factor of the parity check matrix.

In certain embodiments, puncturing the first plurality of systematic bits may comprise omitting to write the first plurality of systematic bits into a circular buffer. In certain embodiments, puncturing the first plurality of systematic bits may comprise skipping the first plurality of systematic bits when reading the coded bits from a circular buffer. In certain embodiments, the first plurality of punctured systematic bits may include an even multiple of Z systematic bits, where Z is a lifting factor of the parity check matrix.

In certain embodiments, performing circular buffer-based rate matching on the generated codeword vector may comprise reading the systematic bits and the parity bits out of a circular buffer to produce the transmission vector for transmission over a wireless channel. Reading the systematic bits and the parity bits out of the circular buffer to produce the transmission vector for transmission over the wireless channel may comprise, if a number of bits of the transmission vector is larger than the total number of bits in the circular buffer, repeating one or more bits in the circular buffer by wrapping around.

In certain embodiments, a subset of the systematic bits may be omitted from being written into the circular buffer.

In certain embodiments, a subset of the parity bits may be omitted from being written into the circular buffer.

In certain embodiments, the method may comprise puncturing a subset of the systematic bits written into the circular buffer in a first transmission over the wireless channel. The method may comprise including the subset of the systematic bits that were punctured in a retransmission over the wireless channel.

In certain embodiments, the method may comprise puncturing bits column-wise such that bits are punctured evenly from each of a plurality of rows and a weight distribution of the parity check matrix is maintained in the circular buffer. The punctured bits may be systematic bits other than the first plurality of systematic bits. The systematic bits and the parity bits may be read out so that a channel interleaver is implemented as part of performing circular buffer-based rate matching on the generated codeword vector. In certain embodiments, the punctured bits may have a higher column weight than non-punctured bits. In certain embodiments, the systematic bits and the parity bits may be read out such that no channel interleaving effect is implemented.

In certain embodiments, performing circular buffer-based rate matching on the generated codeword vector may comprise writing at least a portion of the systematic bits and the parity bits as defined by the PCM into a rectangular circular buffer, the rectangular circular buffer comprising one or more rows and one or more columns.

Figure 10:
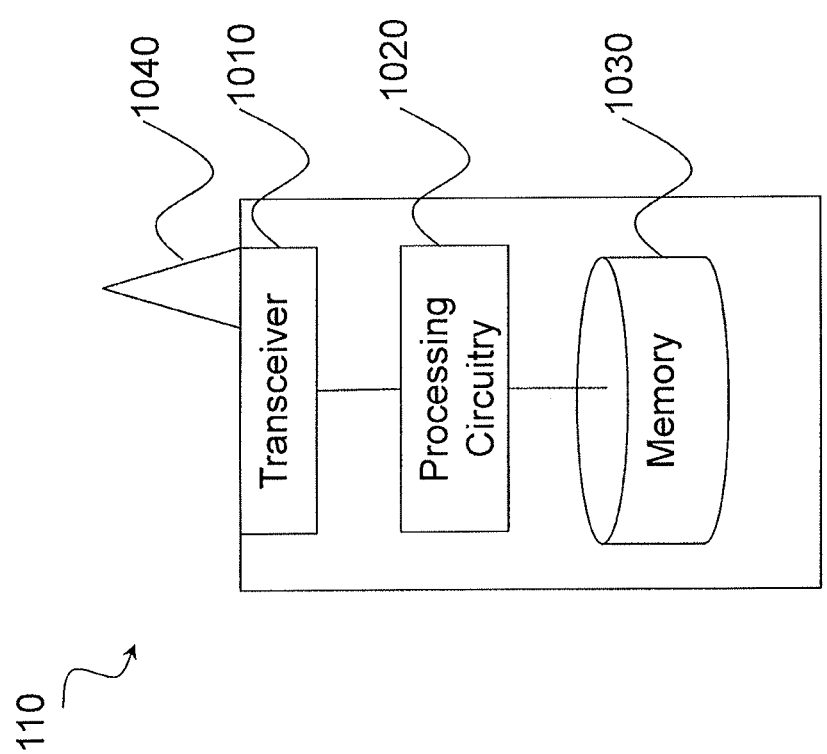
FIG. 10 is a block schematic of an exemplary wireless device, in accordance with certain embodiments.

FIG. 10 is a block schematic of an exemplary wireless device 110, in accordance with certain embodiments. Wireless device 110 may refer to any type of wireless device communicating with a node and/or with another wireless device in a cellular or mobile communication system. Examples of wireless device 110 include a mobile phone, a smart phone, a PDA (Personal Digital Assistant), a portable computer (e.g., laptop, tablet), a sensor, an actuator, a modem, a machine-type-communication (MTC) device/machine-to-machine (M2M) device, laptop embedded equipment (LEE), laptop mounted equipment (LME), USB dongles, a D2D capable device, or another device that can provide wireless communication. A wireless device 110 may also be referred to as UE, a station (STA), a device, or a terminal in some embodiments. Wireless device 110 includes transceiver 1010, processing circuitry 1020, and memory 1030. In some embodiments, transceiver 1010 facilitates transmitting wireless signals to and receiving wireless signals from network node 115 (e.g., via antenna 1040), processing circuitry 1020 executes instructions to provide some or all of the functionality described above as being provided by wireless device 110, and memory 1030 stores the instructions executed by processing circuitry 1020.

Processing circuitry 1020 may include any suitable combination of hardware and software implemented in one or more modules to execute instructions and manipulate data to perform some or all of the described functions of UE 110, such as the functions of wireless device 110 described above in relation to FIGS. 1-9. In some embodiments, processing circuitry 1020 may include, for example, one or more computers, one or more central processing units (CPUs), one or more microprocessors, one or more applications, one or more application specific integrated circuits (ASICs), one or more field programmable gate arrays (FPGAs) and/or other logic.

Memory 1030 is generally operable to store instructions, such as a computer program, software, an application including one or more of logic, rules, algorithms, code, tables, etc. and/or other instructions capable of being executed by processing circuitry 1020. Examples of memory 1030 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information, data, and/or instructions that may be used by processing circuitry 1020.

Other embodiments of wireless device 110 may include additional components beyond those shown in FIG. 10 that may be responsible for providing certain aspects of the wireless device's functionality, including any of the functionality described above and/or any additional functionality (including any functionality necessary to support the solution described above). As just one example, wireless device 110 may include input devices and circuits, output devices, and one or more synchronization units or circuits, which may be part of the processing circuitry 1020. Input devices include mechanisms for entry of data into wireless device 110. For example, input devices may include input mechanisms, such as a microphone, input elements, a display, etc. Output devices may include mechanisms for outputting data in audio, video and/or hard copy format. For example, output devices may include a speaker, a display, etc.

Figure 11:
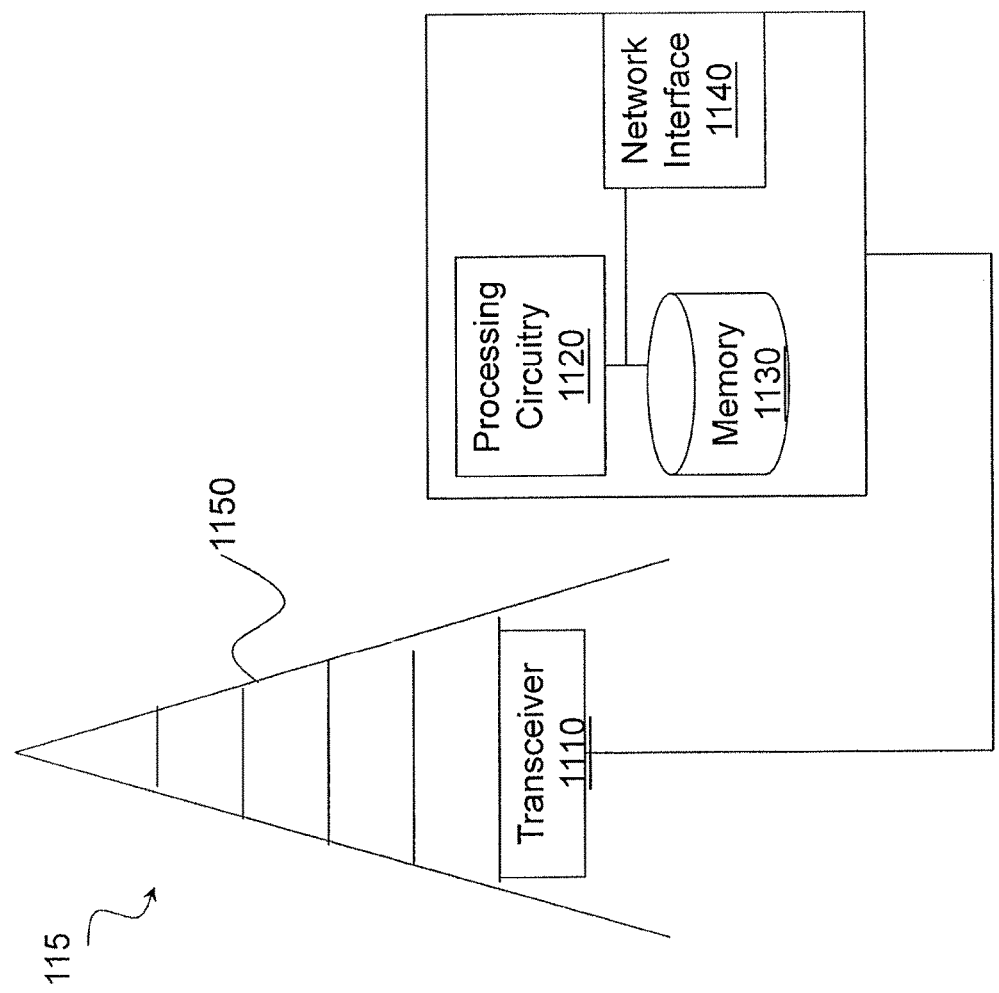
FIG. 11 is a block schematic of an exemplary network node, in accordance with certain embodiments.

FIG. 11 is a block schematic of an exemplary network node 115, in accordance with certain embodiments. Network node 115 may be any type of radio network node or any network node that communicates with a UE and/or with another network node. Examples of network node 115 include an eNodeB, a gNB, a node B, a base station, a wireless access point (e.g., a Wi-Fi access point), a low power node, a base transceiver station (BTS), relay, donor node controlling relay, transmission points, transmission nodes, remote RF unit (RRU), remote radio head (RRH), multi-standard radio (MSR) radio node such as MSR BS, nodes in distributed antenna system (DAS), O&M, OSS, SON, positioning node (e.g., E-SMLC), MDT, or any other suitable network node. Network nodes 115 may be deployed throughout network 100 as a homogenous deployment, heterogeneous deployment, or mixed deployment. A homogeneous deployment may generally describe a deployment made up of the same (or similar) type of network nodes 115 and/or similar coverage and cell sizes and inter-site distances. A heterogeneous deployment may generally describe deployments using a variety of types of network nodes 115 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 115 may include one or more of transceiver 1110, processing circuitry 1120, memory 1130, and network interface 1140. In some embodiments, transceiver 1110 facilitates transmitting wireless signals to and receiving wireless signals from wireless device 110 (e.g., via antenna 1150), processing circuitry 1120 executes instructions to provide some or all of the functionality described above as being provided by a network node 115, memory 1130 stores the instructions executed by processing circuitry 1120, and network interface 1140 communicates signals to backend network components, such as a gateway, switch, router, Internet, Public Switched Telephone Network (PSTN), core network nodes or radio network controllers 130, etc.

Processing circuitry 1120 may include any suitable combination of hardware and software implemented in one or more modules to execute instructions and manipulate data to perform some or all of the described functions of network node 115, such as those described above in relation to FIGS. 1-9. In some embodiments, processing circuitry 1120 may include, for example, one or more computers, one or more central processing units (CPUs), one or more microprocessors, one or more applications, and/or other logic.

Memory 1130 is generally operable to store instructions, such as a computer program, software, an application including one or more of logic, rules, algorithms, code, tables, etc. and/or other instructions capable of being executed by processing circuitry 1120. Examples of memory 1130 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 1140 is communicatively coupled to processing circuitry 1120 and may refer to any suitable device operable to receive input for network node 115, send output from network node 115, perform suitable processing of the input or output or both, communicate to other devices, or any combination of the preceding. Network interface 1140 may include appropriate hardware (e.g., port, modem, network interface card, etc.) and software, including protocol conversion and data processing capabilities, to communicate through a network.

Other embodiments of network node 115 may include additional components beyond those shown in FIG. 11 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components.

Figure 12:
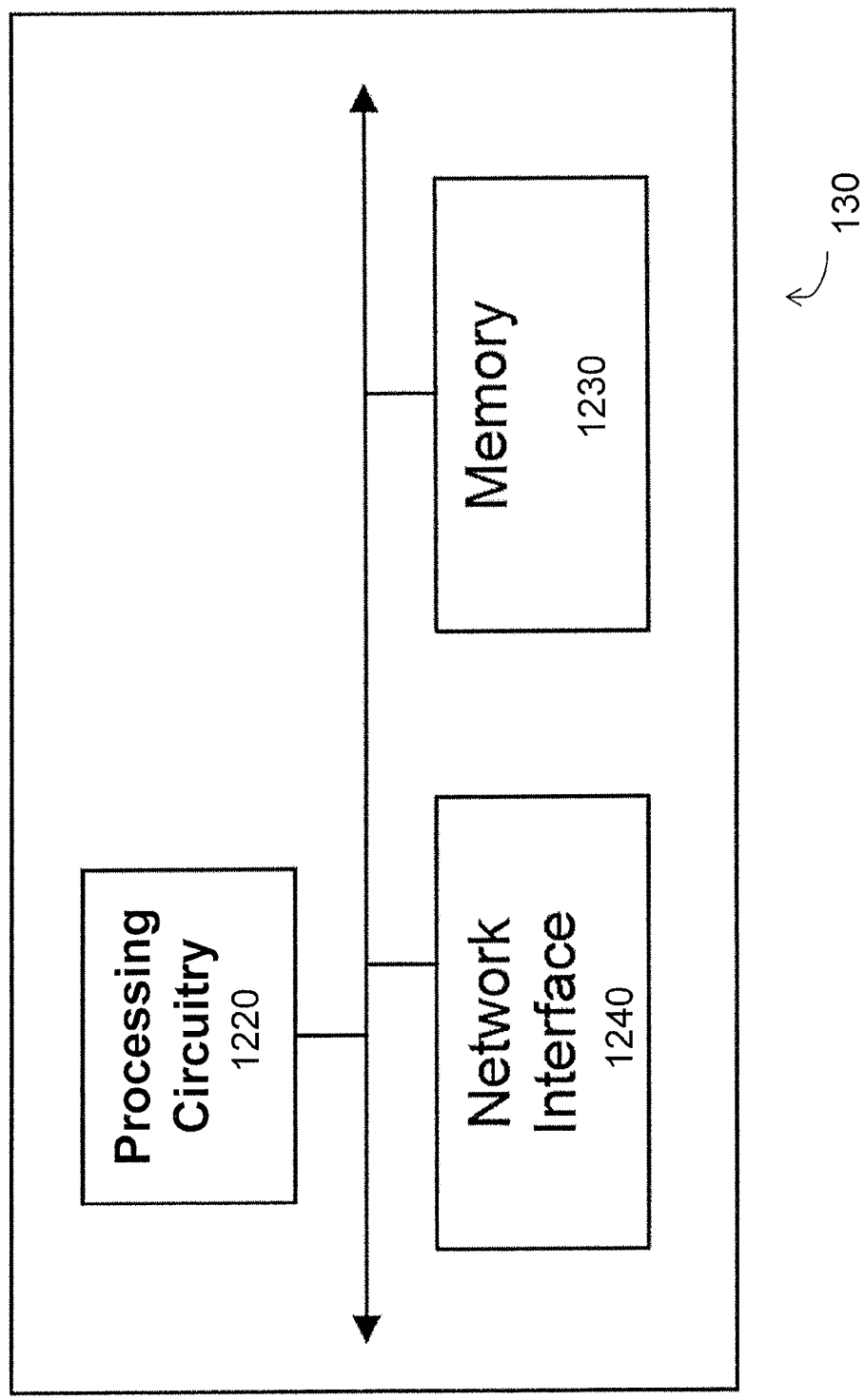
FIG. 12 is a block schematic of an exemplary radio network controller or core network node, in accordance with certain embodiments.

FIG. 12 is a block schematic of an exemplary radio network controller or core network node 130, in accordance with certain embodiments. Examples of network nodes can include a mobile switching center (MSC), a serving GPRS support node (SGSN), a mobility management entity (MME), a radio network controller (RNC), a base station controller (BSC), and so on. The radio network controller or core network node 130 includes processing circuitry 1220, memory 1230, and network interface 1240. In some embodiments, processing circuitry 1220 executes instructions to provide some or all of the functionality described above as being provided by the network node, memory 1230 stores the instructions executed by processing circuitry 1220, and network interface 1240 communicates signals to any suitable node, such as a gateway, switch, router, Internet, Public Switched Telephone Network (PSTN), network nodes 115, radio network controllers or core network nodes 130, etc.

Processing circuitry 1220 may include any suitable combination of hardware and software implemented in one or more modules to execute instructions and manipulate data to perform some or all of the described functions of the radio network controller or core network node 130. In some embodiments, processing circuitry 1220 may include, for example, one or more computers, one or more central processing units (CPUs), one or more microprocessors, one or more applications, and/or other logic.

Memory 1230 is generally operable to store instructions, such as a computer program, software, an application including one or more of logic, rules, algorithms, code, tables, etc. and/or other instructions capable of being executed by processing circuitry 1220. Examples of memory 1230 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 1240 is communicatively coupled to processing circuitry 1220 and may refer to any suitable device operable to receive input for the network node, send output from the network node, perform suitable processing of the input or output or both, communicate to other devices, or any combination of the preceding. Network interface 1240 may include appropriate hardware (e.g., port, modem, network interface card, etc.) and software, including protocol conversion and data processing capabilities, to communicate through a network.

Other embodiments of the network node may include additional components beyond those shown in FIG. 12 that may be responsible for providing certain aspects of the network node's functionality, including any of the functionality described above and/or any additional functionality (including any functionality necessary to support the solution described above).

Figure 13:
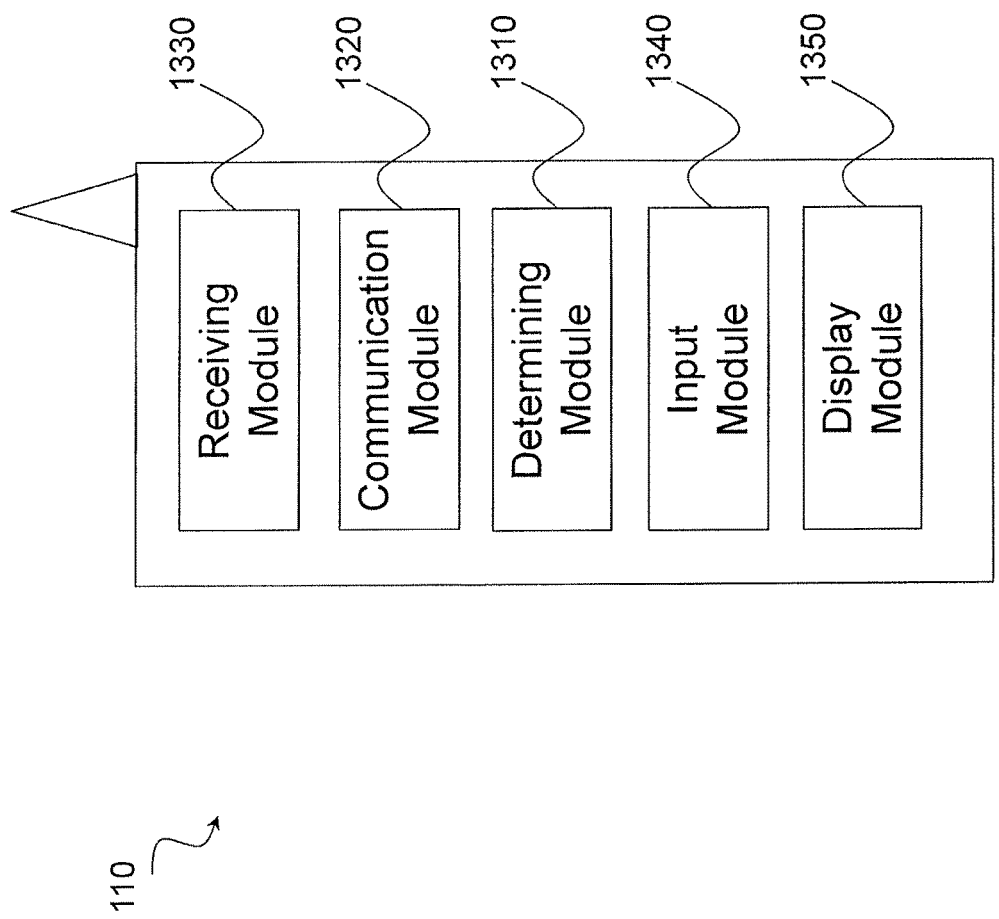
FIG. 13 is a block schematic of an exemplary wireless device, in accordance with certain embodiments.

FIG. 13 is a schematic block diagram of an exemplary wireless device, in accordance with certain embodiments. Wireless device 110 may include one or more modules. For example, wireless device 110 may include a determining module 1310, a communication module 1320, a receiving module 1330, an input module 1340, a display module 1350; and any other suitable modules. In some embodiments, one or more of determining module 1310, communication module 1320, receiving module 1330, input module 1340, display module 1350, or any other suitable module may be implemented using one or more processors, such as processing circuitry 1020 described above in relation to FIG. 10. In certain embodiments, the functions of two or more of the various modules may be combined into a single module. Wireless device 110 may perform the rate matching methods for LDPC codes described above in relation to FIGS. 1-9.

Determining module 1310 may perform the processing functions of wireless device 110. In certain embodiments, wireless device 110 may perform the functions of the first node described above in relation to FIGS. 1-9. In such a scenario, determining module 1310 may generate a codeword vector by encoding the set of information bits with a low-density parity-check code, wherein the codeword vector is composed of systematic bits and parity bits. As part of generating the codeword vector by encoding the set of information bits, determining module 1310 may attach dummy bits to the set of information bits, the dummy bits comprising bits of known value, to produce an information vector, and encoding the information vector. In certain embodiments, determining module 1310 may puncture the attached dummy bits. As part of puncturing the attached dummy bits, determining module 1310 may omit writing the attached dummy bits into the circular buffer. As part of puncturing the attached dummy bits, determining module 1310 may skip the attached dummy bits when reading the coded bits from the circular buffer.

As another example, determining module 1310 may perform circular buffer-based rate matching on the generated codeword vector to produce the coded bits for transmission, wherein the circular buffer-based rate matching comprises puncturing a first plurality of systematic bits. As another example, determining module 1310 may perform circular buffer-based rate matching on the generated codeword vector to produce coded bits for a retransmission, wherein the circular buffer-based rate matching for the retransmission comprises puncturing the first plurality of systematic bits.

As another example, determining module 1310 may puncture the first plurality of systematic bits by omitting to write the first plurality of systematic bits into a circular buffer. As another example, determining module 1310 may puncture the first plurality of systematic bits by skipping the first plurality of systematic bits when reading the coded bits from a circular buffer.

As another example, determining module 1310 may perform circular buffer-based rate matching on the generated codeword vector by reading the systematic bits and the parity bits out of a circular buffer to produce the transmission vector for transmission over a wireless channel. In reading the systematic bits and the parity bits out of the circular buffer to produce the transmission vector for transmission over the wireless channel, determining module 1310 may, if a number of bits of the transmission vector is larger than the total number of bits in the circular buffer, repeat one or more bits in the circular buffer by wrapping around.

As another example, determining module 1310 may puncture a subset of the systematic bits written into the circular buffer in a first transmission over the wireless channel, and include the subset of the systematic bits that were punctured in a retransmission over the wireless channel. Determining module 1310 may puncture bits column-wise such that bits are punctured evenly from each of a plurality of rows and a weight distribution of the parity check matrix is maintained in the circular buffer.

As another example, determining module 1310 may read out the systematic bits and the parity bits so that a channel interleaver is implemented as part of performing circular buffer-based rate matching on the generated codeword vector. As another example, determining module 1310 may read out the systematic bits and the parity bits such that no channel interleaving effect is implemented.

As another example, determining module 1310 may perform circular buffer-based rate matching on the generated codeword vector by writing at least a portion of the systematic bits and the parity bits as defined by the parity check matrix into a rectangular circular buffer, the rectangular circular buffer comprising one or more rows and one or more columns.

Determining module 1310 may include or be included in one or more processors, such as processing circuitry 1020 described above in relation to FIG. 10. Determining module 1310 may include analog and/or digital circuitry configured to perform any of the functions of determining module 1310 and/or processing circuitry 1020 described above. The functions of determining module 1310 described above may, in certain embodiments, be performed in one or more distinct modules.

Communication module 1320 may perform the transmission functions of wireless device 110. Communication module 1320 may include a transmitter and/or a transceiver, such as transceiver 1010 described above in relation to FIG. 10. Communication module 1320 may include circuitry configured to wirelessly transmit messages and/or signals. In particular embodiments, communication module 1320 may receive messages and/or signals for transmission from determining module 1310. In certain embodiments, the functions of communication module 1320 described above may be performed in one or more distinct modules.

Receiving module 1330 may perform the receiving functions of wireless device 110. Receiving module 1330 may include a receiver and/or a transceiver. Receiving module 1330 may include a receiver and/or a transceiver, such as transceiver 1010 described above in relation to FIG. 10. Receiving module 1330 may include circuitry configured to wirelessly receive messages and/or signals. In particular embodiments, receiving module 1330 may communicate received messages and/or signals to determining module 1310. The functions of receiving module 1330 described above may, in certain embodiments, be performed in one or more distinct modules.

Input module 1340 may receive user input intended for wireless device 110. For example, the input module may receive key presses, button presses, touches, swipes, audio signals, video signals, and/or any other appropriate signals. The input module may include one or more keys, buttons, levers, switches, touchscreens, microphones, and/or cameras. The input module may communicate received signals to determining module 1310. The functions of input module 1340 described above may, in certain embodiments, be performed in one or more distinct modules.

Display module 1350 may present signals on a display of wireless device 110. Display module 1350 may include the display and/or any appropriate circuitry and hardware configured to present signals on the display. Display module 1350 may receive signals to present on the display from determining module 1310. The functions of display module 1350 described above may, in certain embodiments, be performed in one or more distinct modules.

Determining module 1310, communication module 1320, receiving module 1330, input module 1340, and display module 1350 may include any suitable configuration of hardware and/or software. Wireless device 110 may include additional modules beyond those shown in FIG. 13 that may be responsible for providing any suitable functionality, including any of the functionality described above and/or any additional functionality (including any functionality necessary to support the various solutions described herein).

Figure 14:
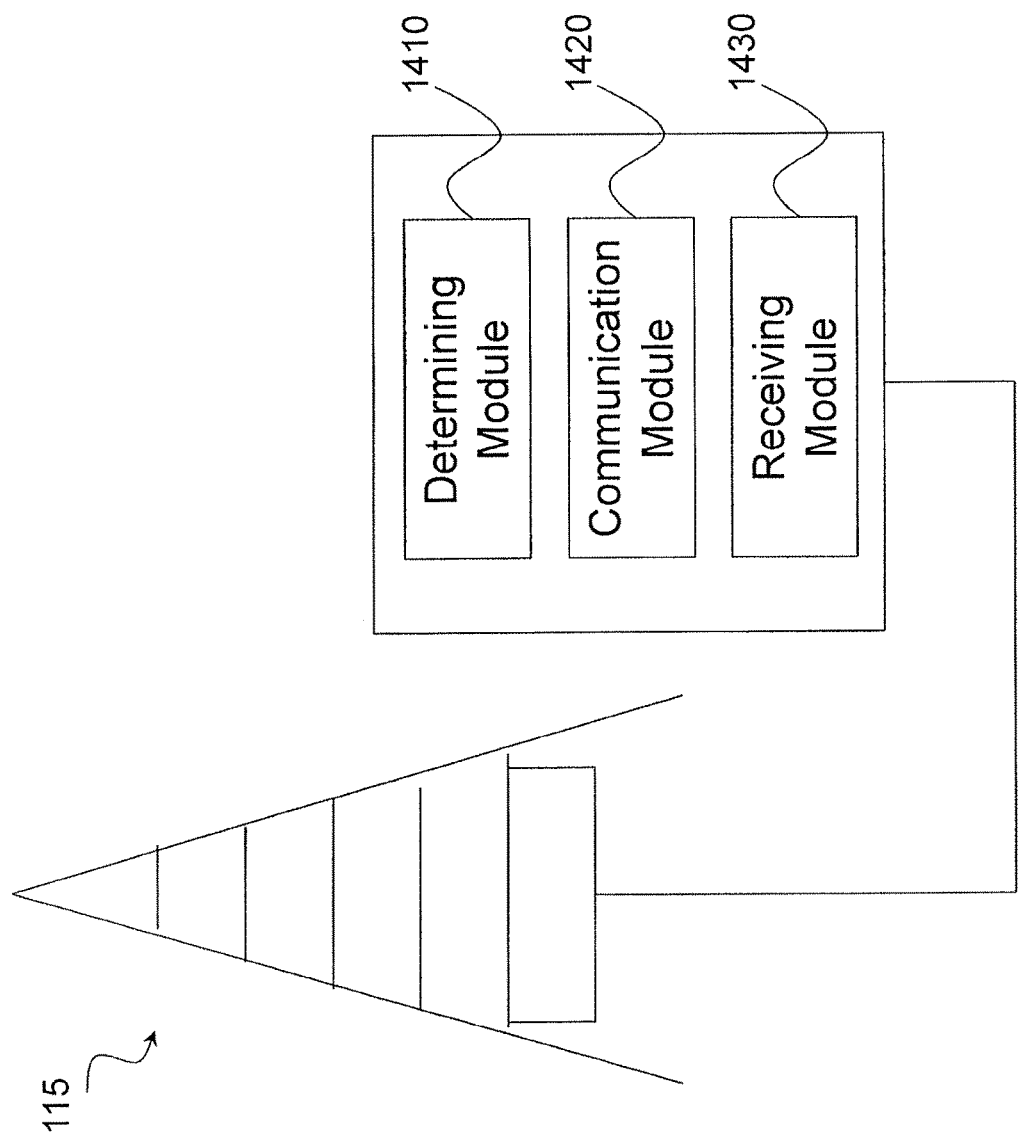
FIG. 14 is a block schematic of an exemplary network node, in accordance with certain embodiments.

FIG. 14 is a schematic block diagram of an exemplary network node 115, in accordance with certain embodiments. Network node 115 may include one or more modules. For example, network node 115 may include determining module 1410, communication module 1420, receiving module 1430, and any other suitable modules. In some embodiments, one or more of determining module 1410, communication module 1420, receiving module 1430, or any other suitable module may be implemented using one or more processors, such as processing circuitry 1120 described above in relation to FIG. 11. In certain embodiments, the functions of two or more of the various modules may be combined into a single module. Network node 115 may perform the rate matching methods for LDPC codes described above with respect to FIGS. 1-9.

Determining module 1410 may perform the processing functions of network node 115. In certain embodiments, network node 115 may perform the functions of the first node described above in relation to FIGS. 1-9. In such a scenario, determining module 1410 may generate a codeword vector by encoding the set of information bits with a low-density parity-check code, wherein the codeword vector is composed of systematic bits and parity bits. As part of generating the codeword vector by encoding the set of information bits, determining module 1410 may attach dummy bits to the set of information bits, the dummy bits comprising bits of known value, to produce an information vector, and encoding the information vector. In certain embodiments, determining module 1410 may puncture the attached dummy bits. As part of puncturing the attached dummy bits, determining module 1410 may omit writing the attached dummy bits into the circular buffer. As part of puncturing the attached dummy bits, determining module 1410 may skip the attached dummy bits when reading the coded bits from the circular buffer.

As another example, determining module 1410 may perform circular buffer-based rate matching on the generated codeword vector to produce the coded bits for transmission, wherein the circular buffer-based rate matching comprises puncturing a first plurality of systematic bits. As another example, determining module 1410 may perform circular buffer-based rate matching on the generated codeword vector to produce coded bits for a retransmission, wherein the circular buffer-based rate matching for the retransmission comprises puncturing the first plurality of systematic bits.

As another example, determining module 1410 may puncture the first plurality of systematic bits by omitting to write the first plurality of systematic bits into a circular buffer. As another example, determining module 1410 may puncture the first plurality of systematic bits by skipping the first plurality of systematic bits when reading the coded bits from a circular buffer.

As another example, determining module 1410 may perform circular buffer-based rate matching on the generated codeword vector by reading the systematic bits and the parity bits out of a circular buffer to produce the transmission vector for transmission over a wireless channel. In reading the systematic bits and the parity bits out of the circular buffer to produce the transmission vector for transmission over the wireless channel, determining module 1410 may, if a number of bits of the transmission vector is larger than the total number of bits in the circular buffer, repeat one or more bits in the circular buffer by wrapping around.

As another example, determining module 1410 may puncture a subset of the systematic bits written into the circular buffer in a first transmission over the wireless channel, and include the subset of the systematic bits that were punctured in a retransmission over the wireless channel. Determining module 1410 may puncture bits column-wise such that bits are punctured evenly from each of a plurality of rows and a weight distribution of the parity check matrix is maintained in the circular buffer.

As another example, determining module 1410 may read out the systematic bits and the parity bits so that a channel interleaver is implemented as part of performing circular buffer-based rate matching on the generated codeword vector. As another example, determining module 1410 may read out the systematic bits and the parity bits such that no channel interleaving effect is implemented.

As another example, determining module 1410 may perform circular buffer-based rate matching on the generated codeword vector by writing at least a portion of the systematic bits and the parity bits as defined by the parity check matrix into a rectangular circular buffer, the rectangular circular buffer comprising one or more rows and one or more columns.

Determining module 1410 may include or be included in one or more processors, such as processing circuitry 1120 described above in relation to FIG. 11. Determining module 1410 may include analog and/or digital circuitry configured to perform any of the functions of determining module 1410 and/or processing circuitry 1120 described above. The functions of determining module 1410 may, in certain embodiments, be performed in one or more distinct modules.

Communication module 1420 may perform the transmission functions of network node 115. Communication module 1420 may transmit messages to one or more of wireless devices 110. Communication module 1420 may include a transmitter and/or a transceiver, such as transceiver 1110 described above in relation to FIG. 11. Communication module 1420 may include circuitry configured to wirelessly transmit messages and/or signals. In particular embodiments, communication module 1420 may receive messages and/or signals for transmission from determining module 1410 or any other module. The functions of communication module 1420 may, in certain embodiments, be performed in one or more distinct modules.

Receiving module 1430 may perform the receiving functions of network node 115. Receiving module 1430 may receive any suitable information from a wireless device. Receiving module 1430 may include a receiver and/or a transceiver, such as transceiver 1110 described above in relation to FIG. 11. Receiving module 1430 may include circuitry configured to wirelessly receive messages and/or signals. In particular embodiments, receiving module 1430 may communicate received messages and/or signals to determining module 1410 or any other suitable module. The functions of receiving module 1430 may, in certain embodiments, be performed in one or more distinct modules.

Determining module 1410, communication module 1420, and receiving module 1430 may include any suitable configuration of hardware and/or software. Network node 115 may include additional modules beyond those shown in FIG. 14 that may be responsible for providing any suitable functionality, including any of the functionality described above and/or any additional functionality (including any functionality necessary to support the various solutions described herein).

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations used in the preceding description include:
AP Access Point
BS Base Station
BSC Base Station Controller
BTS Base Transceiver Station
CPE Customer Premises Equipment
D2D Device-to-device
DAS Distributed Antenna System
DL Downlink
eNB evolved Node B
FDD Frequency Division Duplex
LAN Local Area Network
LEE Laptop Embedded Equipment
LME Laptop Mounted Equipment
LDPC Low-density parity-check
LTE Long Term Evolution
M2M Machine-to-Machine
MAN Metropolitan Area Network
MCE Multi-cell/multicast Coordination Entity
NAS Non-Access Stratum
OFDM Orthogonal Frequency Division Multiplexing
PCM Parity-Check Matrix
PDCCH Physical Downlink Control Channel
PDSCH Physical Downlink Shared Channel
PRB Physical Resource Block
PSTN Public Switched Telephone Network
PUSCH Physical Uplink Shared Channel
PUCCH Physical Uplink Control Channel
QC Quasi-Cyclic
RB Resource Block
RNC Radio Network Controller
RRC Radio Resource Control
RRH Remote Radio Head
RRU Remote Radio Unit
TBS Transport block size
TDD Time Division Duplex
TFRE Time Frequency Resource Element
UE User Equipment
UL Uplink
WAN Wide Area Network

The invention claimed is:

1. A method of producing a set of coded bits from a set of information bits for transmission between a first node and a second node in a wireless communications system, the method comprising:
generating a codeword vector by encoding the set of information bits with a low-density parity-check code, wherein the codeword vector is composed of systematic bits and parity bits; and
performing circular buffer-based rate matching on the generated codeword vector to produce the coded bits for transmission, wherein:
the circular buffer-based rate matching comprises puncturing a first plurality of systematic bits; and
the punctured bits have a higher column weight than non-punctured bits.

2. The method of claim 1, wherein the low-density parity-check code is specified through a parity check matrix.

3. The method of claim 1, wherein the first plurality of systematic bits that are punctured precedes, in the codeword vector, a second plurality of systematic bits that are not punctured.

4. The method of claim 1, wherein a plurality of redundancy versions are defined over the circular buffer such that coded bits for a retransmission are read from the circular buffer according to a corresponding redundancy version defined for the retransmission.

5. The method of claim 4, further comprising performing circular buffer-based rate matching on the generated codeword vector to produce coded bits for the retransmission, wherein the circular buffer-based rate matching for the retransmission comprises puncturing the first plurality of systematic bits.

6. The method of claim 5, wherein the first plurality of systematic bits punctured for the retransmission includes an even multiple of Z systematic bits, where Z is a lifting factor of the parity check matrix.

7. The method of claim 1, wherein puncturing the first plurality of systematic bits comprises omitting to write the first plurality of systematic bits into a circular buffer.

8. The method of claim 1, wherein puncturing the first plurality of systematic bits comprises skipping the first plurality of systematic bits when reading the coded bits from a circular buffer.

9. The method of claim 1, wherein the first plurality of punctured systematic bits includes an even multiple of Z systematic bits, where Z is a lifting factor of the parity check matrix.

10. The method of claim 1, wherein performing circular buffer-based rate matching on the generated codeword vector comprises:
reading the systematic bits and the parity bits out of a circular buffer to produce the transmission vector for transmission over a wireless channel.

11. The method of claim 10, wherein reading the systematic bits and the parity bits out of the circular buffer to produce the transmission vector for transmission over the wireless channel comprises:
if a number of bits of the transmission vector is larger than the total number of bits in the circular buffer, repeating one or more bits in the circular buffer by wrapping around.

12. The method of claim 1, wherein generating the codeword vector by encoding the set of information bits comprises:
attaching dummy bits to the set of information bits, the dummy bits comprising bits of known value, to produce an information vector; and
encoding the information vector.

13. The method of claim 12, wherein the attached dummy bits comprise a second plurality of systematic bits that is separate from the punctured first plurality of systematic bits.

14. The method of claim 13, comprising puncturing the attached dummy bits.

15. The method of claim 14, wherein puncturing the attached dummy bits comprises omitting to write the attached dummy bits into the circular buffer.

16. The method of claim 14, wherein puncturing the attached dummy bits comprises skipping the attached dummy bits when reading the coded bits from the circular buffer.

17. The method of claim 1, wherein a subset of the systematic bits are omitted from being written into the circular buffer.

18. The method of claim 1, comprising:
puncturing a subset of the systematic bits written into the circular buffer in a first transmission over the wireless channel; and
including the subset of the systematic bits that were punctured in a retransmission over the wireless channel.

19. The method of claim 1, comprising:
puncturing bits column-wise such that bits are punctured evenly from each of a plurality of rows and a weight distribution of the parity check matrix is maintained in the circular buffer.

20. The method of claim 19, wherein the punctured bits are systematic bits other than the first plurality of systematic bits.

21. The method of claim 1, wherein the systematic bits and the parity bits are read out so that a channel interleaver is implemented as part of performing circular buffer-based rate matching on the generated codeword vector.

22. The method of claim 1, wherein the systematic bits and the parity bits are read out such that no channel interleaving effect is implemented.

23. The method of claim 1, wherein a subset of the parity bits are omitted from being written into the circular buffer.

24. The method of claim 1, wherein performing circular buffer-based rate matching on the generated codeword vector comprises:
writing at least a portion of the systematic bits and the parity bits as defined by a parity check matrix into a rectangular circular buffer, the rectangular circular buffer comprising one or more rows and one or more columns.

25. The method claim 1, wherein the wireless communications system comprises a new radio system.

26. A first node for producing a set of coded bits from a set of information bits for transmission to a second node in a wireless communications system, the first node comprising:
processing circuitry, the processing circuitry configured to:
generate a codeword vector by encoding the set of information bits with a low-density parity-check code, wherein the codeword vector is composed of systematic bits and parity bits; and
perform circular buffer-based rate matching on the generated codeword vector to produce the coded bits for transmission, wherein:
the circular buffer-based rate matching comprises puncturing a first plurality of systematic bits; and
the punctured bits have a higher column weight than non-punctured bits.

27. The first node of claim 26, wherein the low-density parity-check code is specified through a parity check matrix.

28. The first node of claim 26, wherein the first plurality of systematic bits that are punctured precedes, in the codeword vector, a second plurality of systematic bits that are not punctured.

29. The first node of claim 26, wherein a plurality of redundancy versions are defined over the circular buffer such that coded bits for a retransmission are read from the circular buffer according to a corresponding redundancy version defined for the retransmission.

30. The first node of claim 29, wherein the processing circuitry is further configured to perform circular buffer-based rate matching on the generated codeword vector to produce coded bits for the retransmission, wherein the circular buffer-based rate matching for the retransmission comprises puncturing the first plurality of systematic bits.

31. The first node of claim 30, wherein the first plurality of systematic bits punctured for the retransmission includes an even multiple of Z systematic bits, where Z is a lifting factor of the parity check matrix.

32. The first node of claim 26, wherein the processing circuitry configured to puncture the first plurality of systematic bits comprises processing circuitry configured to omit writing the first plurality of systematic bits into a circular buffer.

33. The first node of claim 26, wherein the processing circuitry configured to puncture the first plurality of systematic bits comprises processing circuity configured to skip the first plurality of systematic bits when reading the coded bits from a circular buffer.

34. The first node of claim 26, wherein the first plurality of punctured systematic bits includes an even multiple of Z systematic bits, where Z is a lifting factor of the parity check matrix.

35. The first node of claim 26, wherein the processing circuitry configured to perform circular buffer-based rate matching on the generated codeword vector comprises processing circuitry configured to:
read the systematic bits and the parity bits out of a circular buffer to produce the transmission vector for transmission over a wireless channel.

36. The first node of claim 35, wherein the processing circuitry configured to read the systematic bits and the parity bits out of the circular buffer to produce the transmission vector for transmission over the wireless channel comprises processing circuitry configured to:
if a number of bits of the transmission vector is larger than the total number of bits in the circular buffer, repeat one or more bits in the circular buffer by wrapping around.

37. The first node of claim 26, wherein the processing circuitry configured to generate the codeword vector by encoding the set of information bits comprises processing circuitry configured to:
attach dummy bits to the set of information bits, the dummy bits comprising bits of known value, to produce an information vector; and
encode the information vector.

38. The first node of claim 37, wherein the attached dummy bits comprise a second plurality of systematic bits that is separate from the punctured first plurality of systematic bits.

39. The first node of claim 38, wherein the processing circuitry is further configured to puncture the attached dummy bits.

40. The first node of claim 39, wherein the processing circuitry configured to puncture the attached dummy bits comprises processing circuitry configured to omit writing the attached dummy bits into the circular buffer.

41. The first node of claim 39, wherein the processing circuitry configured to puncture the attached dummy bits comprises processing circuitry configured to skip the attached dummy bits when reading the coded bits from the circular buffer.

42. The first node of claim 26, wherein a subset of the systematic bits are omitted from being written into the circular buffer.

43. The first node of claim 26, wherein the processing circuitry is further configured to:
puncture a subset of the systematic bits written into the circular buffer in a first transmission over the wireless channel; and
include the subset of the systematic bits that were punctured in a retransmission over the wireless channel.

44. The first node of claim 26, wherein the processing circuitry is further configured to:
puncture bits column-wise such that bits are punctured evenly from each of a plurality of rows and a weight distribution of the parity check matrix is maintained in the circular buffer.

45. The first node of claim 44, wherein the punctured bits are systematic bits other than the first plurality of systematic bits.

46. The first node of claim 26, wherein the processing circuitry is configured to read out the systematic bits and the parity bits so that a channel interleaver is implemented as part of performing circular buffer-based rate matching on the generated codeword vector.

47. The first node of claim 26, wherein the processing circuitry is configured to read out the systematic bits and the parity bits such that no channel interleaving effect is implemented.

48. The first node of claim 26, wherein a subset of the parity bits are omitted from being written into the circular buffer.

49. The first node of claim 26, wherein the processing circuitry configured to perform circular buffer-based rate matching on the generated codeword vector comprises processing circuitry configured to:
write at least a portion of the systematic bits and the parity bits as defined by a parity check matrix into a rectangular circular buffer, the rectangular circular buffer comprising one or more rows and one or more columns.

50. The first node of claim 26, wherein the wireless communications system comprises a new radio system.

* * * * *

UNITED STATES PATENT AND TRADEMARK OFFICE
CERTIFICATE OF CORRECTION

PATENT NO. : 10,516,419 B2
APPLICATION NO. : 15/564248
DATED : December 24, 2019
INVENTOR(S) : Andersson et al.

It is certified that error appears in the above-identified patent and that said Letters Patent is hereby corrected as shown below:

In the Specification

Column 6, Line 65, delete "laptop embedded equipped" and insert -- laptop embedded equipment --, therefor.

Column 8, Line 25, delete "km" and insert -- $k_{tx}$ --, therefor.

Column 9, Line 1, delete "$u_1, \ldots u_{z-1}, |u_z,$" and insert -- $u_1, \ldots u_{z-1}, | u_z$, --, therefor.

Column 9, Lines 1-2, delete "$u\_(k_{b-1})*Z, u\_(k_{b-1})*Z+1, \ldots u\_(k_b*Z-1)].$" and insert -- $u\_(k_{b-1})*Z, u\_(k_{b-1})*Z+1, \ldots u\_(k_b*Z-1)].$ --, therefor.

Column 9, Lines 4-5, delete "$p\_(m_{b-1})*Z, p\_(m_{b-1})*Z+1, \ldots p\_(m_b*Z-1)].$" and insert -- $p\_(m_{b-1})*Z, p\_(m_{b-1})*Z+1, \ldots p\_(m_b*Z-1)].$ --, therefor.

Column 15, Line 6, delete "and/or or" and insert -- and/or --, therefor.

Column 16, Line 20, delete "and/or or" and insert -- and/or --, therefor.

Column 17, Line 12, delete "and/or or" and insert -- and/or --, therefor.

Column 17, Line 37, delete "1350;" and insert -- 1350, --, therefor.

In the Claims

Column 24, Line 18, in Claim 25, delete "The method claim" and insert -- The method of claim --, therefor.

Column 24, Line 65, in Claim 33, delete "circuity" and insert -- circuitry --, therefor.

Signed and Sealed this
Ninth Day of June, 2020

Andrei Iancu
*Director of the United States Patent and Trademark Office*